(12) United States Patent
Weng et al.

(10) Patent No.: US 11,640,935 B2
(45) Date of Patent: May 2, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chung-Ming Weng, Hsinchu (TW); Chen-Hua Yu, Hsinchu (TW); Chung-Shi Liu, Hsinchu (TW); Hao-Yi Tsai, Hsinchu (TW); Cheng-Chieh Hsieh, Tainan (TW); Hung-Yi Kuo, Taipei (TW); Tsung-Yuan Yu, Taipei (TW); Hua-Kuei Lin, Hsinchu (TW); Hsiu-Jen Lin, Hsinchu County (TW); Ming-Che Ho, Tainan (TW); Yu-Hsiang Hu, Hsinchu (TW); Chewn-Pu Jou, Hsinchu (TW); Cheng-Tse Tang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 10 days.

(21) Appl. No.: 17/377,395

(22) Filed: Jul. 16, 2021

(65) Prior Publication Data
US 2023/0018511 A1    Jan. 19, 2023

(51) Int. Cl.
| | |
|---|---|
| *H01L 29/22* | (2006.01) |
| *H01L 23/498* | (2006.01) |
| *H01L 21/768* | (2006.01) |
| *G02B 6/42* | (2006.01) |
| *H01L 23/00* | (2006.01) |

(52) U.S. Cl.
CPC ...... *H01L 23/49838* (2013.01); *G02B 6/4202* (2013.01); *G02B 6/4274* (2013.01); *H01L 21/7684* (2013.01); *H01L 23/49822* (2013.01); *H01L 24/16* (2013.01); *H01L 2224/16055* (2013.01); *H01L 2224/16112* (2013.01); *H01L 2224/16148* (2013.01); *H01L 2924/19033* (2013.01)

(58) Field of Classification Search
None
See application file for complete search history.

(56) References Cited

U.S. PATENT DOCUMENTS

| | | | | |
|---|---|---|---|---|
| 10,515,886 B2* | 12/2019 | Yazdani | ......... | H01L 21/52 |
| 2015/0036970 A1* | 2/2015 | Lai | ............ | H01L 24/19 |
| | | | | 438/27 |
| 2018/0180808 A1* | 6/2018 | Zhang | ......... | G02B 6/4274 |
| 2019/0041576 A1* | 2/2019 | Byrd | ............ | G02B 6/12002 |

* cited by examiner

*Primary Examiner* — Hung K Vu
(74) *Attorney, Agent, or Firm* — JCIPRNET

(57) ABSTRACT

A semiconductor package includes a redistribution structure, a supporting layer, a semiconductor device, and a transition waveguide structure. The redistribution structure includes a plurality of connectors. The supporting layer is formed over the redistribution structure and disposed beside and between the plurality of connectors. The semiconductor device is disposed on the supporting layer and bonded to the plurality of connectors, wherein the semiconductor device includes a device waveguide. The transition waveguide structure is disposed on the supporting layer adjacent to the semiconductor device, wherein the transition waveguide structure is optically coupled to the device waveguide.

11 Claims, 18 Drawing Sheets

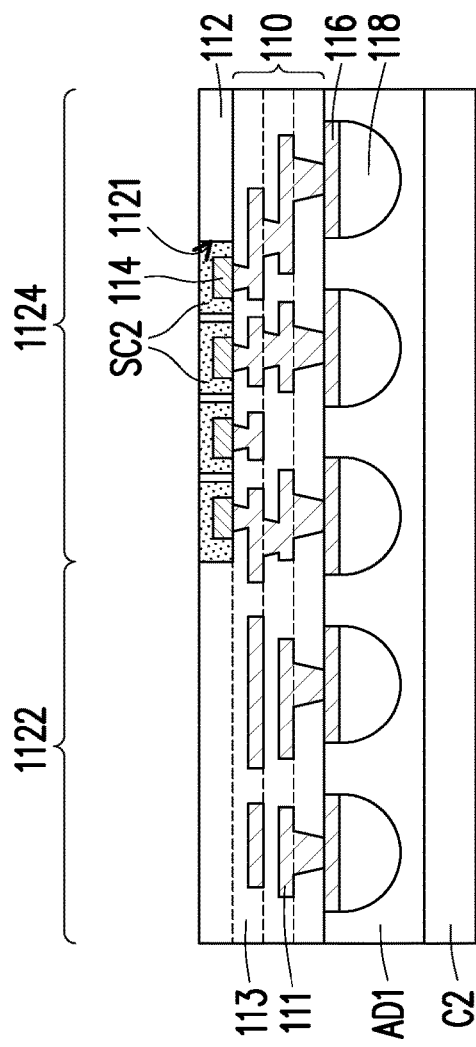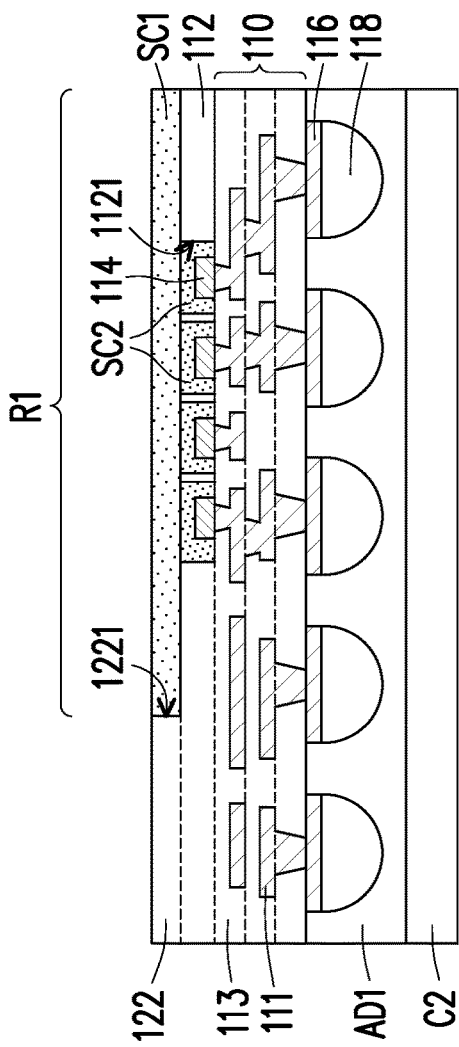

SEMICONDUCTOR PACKAGE AND MANUFACTURING METHOD THEREOF

BACKGROUND

The semiconductor industry has experienced rapid growth due to continuous improvements in the integration density of a variety of circuit components (e.g., transistors, diodes, resistors, capacitors, etc.). For the most part, this improvement in integration density has come from repeated reductions in minimum feature size, which allows more components to be integrated into a given area. Currently, System-on-Integrated-Circuit (SoIC) components are becoming increasingly popular for their multi-functions and compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 11 schematically illustrate cross-sectional views of intermediate stages in the manufacturing of a semiconductor package according to some embodiments of the present disclosure.

DETAILED DESCRIPTION

Figure 1:
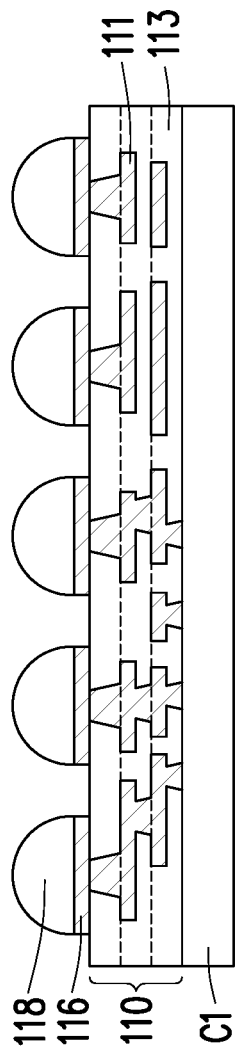

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, it will be understood that when an element is referred to as being "connected to" or "coupled to" another element, it may be directly connected to or coupled to the other element, or one or more intervening elements may be present. Further, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a package and a method of forming the same. Various embodiments presented herein describe formation of a semiconductor package used in photonics applications. Various embodiments presented herein allow for a cost competitive photonics semiconductor package with bandwidth scalability and relaxed accuracy requirement for optical fiber assembly.

FIG. 1 to FIG. 11 schematically illustrate cross-sectional views of intermediate stages in the manufacturing of a semiconductor package according to some embodiments of the present disclosure. Referring to FIG. 1A, a redistribution structure 110 is formed over a carrier substrate C1. In some embodiments, the redistribution structure 110 may be formed over the carrier substrate C1 by depositing conductive layers, patterning the conductive layers to form a plurality of redistribution lines (e.g., the redistribution lines 111). The redistribution lines are at least partially covered with dielectric layers (e.g., dielectric layer 113) and the dielectric layers fill the gaps between the redistribution lines and the conductive lines. The vias may be located on the layers of the redistribution structure 110 respectively and extending through the corresponding dielectric layers for interconnecting the redistribution lines at different layers. The material of the redistribution lines may include a metal or a metal alloy including aluminum, copper, tungsten, and/or alloys thereof.

In detail, a seed layer, such as a copper, titanium, or the like, may be deposited over the carrier 101, such as by sputtering or another physical vapor deposition (PVD) process. A photo resist is deposited on the seed layer and patterned to expose portions of the seed layer by photolithography. The pattern is for a metallization layer on the redistribution structure 110. Conductive material of the redistribution lines and the conductive lines, such as copper, aluminum, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms a metallization layer (e.g., the redistribution lines) of the redistribution structure 110. A dielectric layer is deposited over the metallization layer. The material of the dielectric layer may include polymer such as a polyimide, polybenzoxazole (PBO), benzocyclobutene (BCB), the like, or a combination thereof. The dielectric layer can be deposited by a coating process, a lamination process, the like, or a combination thereof. Vias may be formed through the dielectric layer to the metallization layer using acceptable photolithography techniques.

Subsequent metallization layers and dielectric layers may be formed using the same or similar processes as discussed. Conductive material deposited during the formation of a subsequent metallization layer may be deposited in openings of the previously formed dielectric layers to form vias for electrically connecting respective metallization layers. After forming the topmost dielectric layer, via is formed through the topmost dielectric layer for connectors coupled between the redistribution lines, and another semiconductor device, package, die, and/or another substrate. It should be noted that any number of metallization layers and dielectric layers may be formed, and the redistribution structure 110 in this embodiment is illustrated as an example.

In some embodiments, after the redistribution structure 110 is formed, a plurality of under bump metallization (UBM) layers 116, and a plurality of conductive bumps 118 may be sequentially formed over the redistribution structure 110 and electrically connected to the redistribution structure 110. In some embodiments, the conductive bumps 118 are provided over the redistribution structure 110. In some embodiments, the conductive bumps 118 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. In the present embodiment, the conductive bumps are micro bumps, for example, and each of the conductive bumps 118 may include a solder layer formed above a copper seed layer. An optional nickel layer may be in between the solder layer and the copper seed layer. The copper seed layer and the nickel layer may act as an UBM and a barrier layer for the formation of solder layer. The solder layer may include an electrically conductive solder material, e.g., Sn, Ni, Au, Ag, Cu, Bi, W, Fe, Ferrite, an alloy or combination thereof, or any other suitable material. One of ordinary skill in the art will recognize that there are many suitable arrangements of materials and layers suitable for the formation of the conductive bumps 118. Any suitable materials or layers of material that may be used for the conductive bumps 118 are fully intended to be included within the scope of the current embodiments.

In an alternative embodiment, the redistribution structure 110 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also serve as the substrate. In some embodiments, the substrate may further includes a redistribution structure at the front side. In some alternative embodiments, a system on integrated substrate (SoIS) or an integrated fan-out (InFO) package may also be serves as the redistribution structure 110 herein.

In some embodiments, the carrier substrate C1 may be a glass carrier substrate, a ceramic carrier substrate, or the like. The carrier substrate C1 may be in a wafer form, such that multiple packages can be formed on the carrier substrate C1 simultaneously. In some embodiments, a release layer (not shown) may be provided over the carrier substrate C1 prior to the redistribution structure 110. The release layer may be formed of a polymer-based material, which may be removed along with the carrier substrate C1 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate C1, or may be the like. The top surface of the release layer may be leveled and may have a high degree of planarity.

Figure 2:
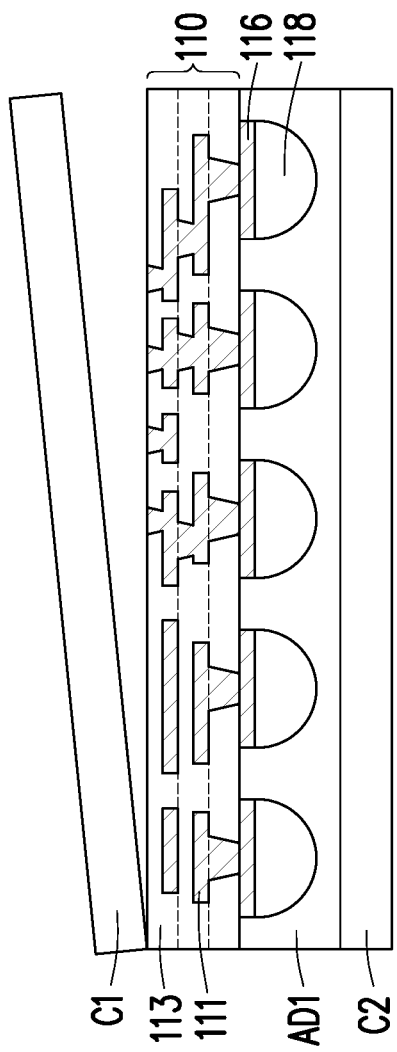

Referring to FIG. 2, the redistribution structure 110, the UBM layers 116, and the conductive connectors 118 are transferred to a carrier substrate C2 using an adhesive layer AD1 provided over the conductive connectors 118. The adhesive layer AD1 may include any suitable adhesive, epoxy, DAF, or the like. The carrier substrate C2 may be a glass carrier substrate, a ceramic carrier substrate, or the like. Then, the carrier substrate C1 can be removed and reveals a planar surface of the redistribution structure 110.

Referring to FIG. 3, in some embodiments, a plurality of connectors 114 are then formed over the surface of the redistribution structure 110 revealed by the carrier substrate C1. In some embodiments, the connectors 114 may be conductive pads, or the like. Then, a supporting layer 112 is formed over the redistribution structure 110, and the supporting layer 112 is disposed beside and between the connectors 114. The material of the supporting layer 112 may be any suitable dielectric material. In some embodiments, the material of the supporting layer 112 may be the same as material of the dielectric layer of the redistribution structure 110, which includes polymer such as a polyimide, polybenzoxazole (PBO), benzocyclobutene (BCB), the like, or a combination thereof. The supporting layer 112 can be deposited by a coating process, a lamination process, the like, or a combination thereof. In some embodiments, the supporting layer 112 includes a mesa portion 1122 and an isolation portion 1124. The mesa portion 1122 is disposed beside the connectors 114 where a semiconductor device 130 is to be mounted and the isolation portion 1124 connects the mesa portion 1122 and surrounds each of the connectors 114. That is, in some embodiments, the isolation portion 1124 of the supporting layer 112 has a plurality of openings 1121 exposing and surrounding the connectors 114 respectively, and the isolation portion 1124 of the supporting layer 112 may functions as a mask layer for the connectors 114.

In the present embodiment shown in FIG. 3, the connectors 114 are non-solder mask defined (NSMD) pads, which means the supporting layer 112 is defined to not make contact with the connectors 114. Herein, the term "NSMD pad" generally refers to the size of the pad being not defined by the mask layer (e.g., supporting layer 112), but only by the diameter of the pad itself. Note that in the embodiment of the connectors 114 being NSMD pads, the openings 1121 of the supporting layer 112 is substantially larger than the connectors 114 so that the supporting layer 112 does not contact or overlap the connectors 114. In other words, the supporting layer 112 is spaced apart from side surfaces of the connectors 114. The larger openings 1121 of the supporting layer 112 leaves a gap between the supporting layer 112 and connectors 114, and the gap exposes a part of the upper surface of the redistribution structure 110. In some embodiments, the opening 1121 is generally circular and concentric with the circular shape of the connectors 114. Since the connector size is able to be reduced with the NSMD pad configuration, more room is created between adjacent pads allowing for easier trace routing. Certainly, the present embodiment is merely for illustration, other types of connectors 114, such as solder mask defined pads, may also be applied herein, and the disclosure is not limited thereto.

In some embodiments, a sacrificial layer SC2 is formed over the redistribution structure 110 and the supporting layer 112. In the present embodiment, the sacrificial layer SC2 fills in the openings 1121 of the supporting layer 112 and covers (encapsulates) the connectors 114, and will be removed at a subsequent processing step. The sacrificial layer SC2 can be any material that can serve to protect and support the supporting layer 112 and the connectors 114 during a subsequent planarization process (e.g., chemical mechanical polishing (CMP) process). In some embodiments, the sacrificial layer SC2 includes polyimide, polyolefin, a combination thereof, or the like and may be formed using spin coating, or the like.

Then, a (first) planarization process, which may be a grinding process, is performed over the supporting layer 112 to remove excess supporting layer 112 and the sacrificial layer SC2. The resulting structure is shown in FIG. 3. The planarization process may include mechanical grinding or chemical mechanical polishing (CMP), for example. After the grinding process, a cleaning step may be optionally performed, for example, to clean and remove the residue generated from the grinding step. However, the disclosure is not limited thereto, and the planarization step may be performed through any other suitable method. Due to the planarization process, the top surface of the mesa portion 1122 are substantially level with the top surface of the isolation portion, and are substantially level with the top surface of the sacrificial layer SC2 as shown in FIG. 3. In the present embodiment, after the planarization process, the thickness of the supporting layer 112 may be substantially greater than the thickness of the connectors 114, which means the sacrificial layer SC2, which is leveled with the supporting layer 112, may still cover the top surfaces of the connectors 114 after the planarization process. In other embodiments, the thickness of the supporting layer 112 may be substantially equal to the thickness of the connectors 114, which means the connectors 114 may be revealed by the planarization process, and the top surfaces of the connectors 114 are substantially coplanar with the top surface of supporting layer 112.

With the configuration of the isolation portion 1124 of the supporting layer 112 surrounding each of the connectors 114, not only the isolation portion 1124 between the connectors 114 keeps the connectors 114 from bridging during subsequent bonding process, but the isolation portion 1124 also provides support to the device mounting region where the connectors 114 are disposed during the planarization process, which improves the yield and performance of the planarization process. Accordingly, the isolation portion 1124 of the supporting layer 112 disposed between the connectors 114 facilitates in achieving a planar base for a semiconductor device (e.g., the semiconductor device 130 shown in FIG. 8) to be disposed thereon, and also facilitates the alignment between transition waveguide and device waveguide of the semiconductor device, which will be explained more in detail later on.

Referring to FIG. 4, a lower dielectric layer 122 is then formed over the supporting layer 112. In some embodiments, the lower dielectric layer 122 includes a concave 1221 exposing a device mounting region R1 of the supporting layer 112. In some embodiments, the lower dielectric layer 122 may be formed in a manner similar to the supporting layer 112, and may be formed of a similar material as the supporting layer 112. For example, the lower dielectric layer 122 may be formed of a photo-sensitive material or a non-photo-sensitive material. For example, the photo-sensitive material includes polybenzoxazole (PBO), polyimide, benzocyclobutene (BCB), or the like; the non-photo-sensitive material includes silicon oxide, or the like. Material of the lower dielectric layer 122 may be formed on the substrate 10 by spin coating, lamination, chemical vapor deposition (CVD), the like, or a combination thereof. Then, the photo-sensitive material layer or the non-photo-sensitive material layer is patterned by an acceptable process to formed the lower dielectric layer 122. The patterning process may include exposing and developing processes when the lower dielectric layer 122 is formed of the photo-sensitive material. The patterning process may include an etching process using, for example, an anisotropic etch when the lower dielectric layer 122 is formed of the non-photo-sensitive material.

Subsequently, a sacrificial layer SC1 is formed over the sacrificial layer SC2 and the mesa portion 1122 that is exposed by the lower dielectric layer 122. That is, the sacrificial layer SC1 fills the concave 1221 of the lower dielectric layer 122. In some embodiments, the sacrificial layer SC1 may be formed in a manner similar to the sacrificial layer SC2, and may be formed of a similar material as the sacrificial layer SC2.

Then, a (second) planarization process, which may be a grinding process, is performed over the lower dielectric layer 122 and the sacrificial layer SC1. The resulting structure is shown in FIG. 4. The planarization process may include mechanical grinding or chemical mechanical polishing (CMP), for example. After the grinding process, a cleaning step may be optionally performed, for example, to clean and remove the residue generated from the grinding step. However, the disclosure is not limited thereto, and the planarization step may be performed through any other suitable method. Due to the planarization process, the top surface of the lower dielectric layer 122 is substantially a flat surface and level with the top surface of the sacrificial layer SC1, which makes the perfect (planar) base for transition waveguide (e.g., the transition waveguide 124 shown in FIG. 5) to lay thereon.

Figure 5:
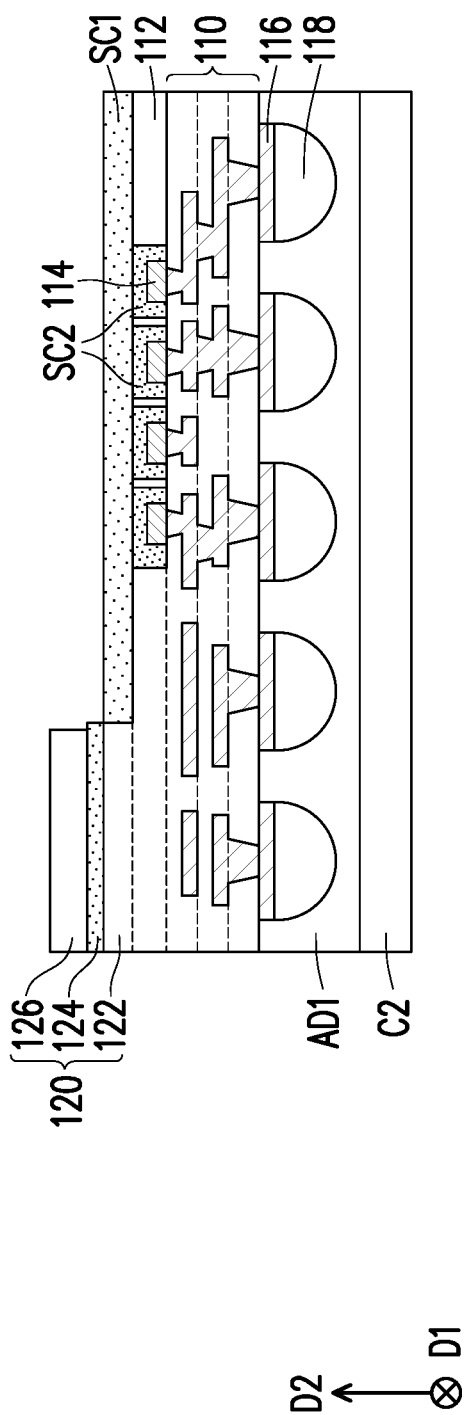

Referring to FIG. 5, the transition waveguide 124 and the upper dielectric layer 126 are sequentially formed (stacked) over the lower dielectric layer 122. Throughout the description, the stack of the lower dielectric layer 122, the transition waveguide 124 and the upper dielectric layer 126 is referred to as a transition waveguide structure 120, wherein the transition waveguide 124 is sandwiched between the lower dielectric layer 122 and the upper dielectric layer 126. The mesa portion of the supporting layer 112 is under the transition waveguide structure 120 and the device waveguide 132 to provide planar base and even support. In some embodiments, the transition waveguide 124 is a polymer waveguide, which may be formed of an organic polymer, such as polyimide, polyolefin, PBO, the like, or a combination thereof. Subsequently, the organic polymer material layer is patterned using suitable photolithography processes. Subsequently, the upper dielectric layer 126 is formed on the transition waveguide 124. The upper dielectric layer 126 may be formed in a manner similar to the lower dielectric layer 122, and may be formed of a similar material as the lower dielectric layer 122.

Figure 6:
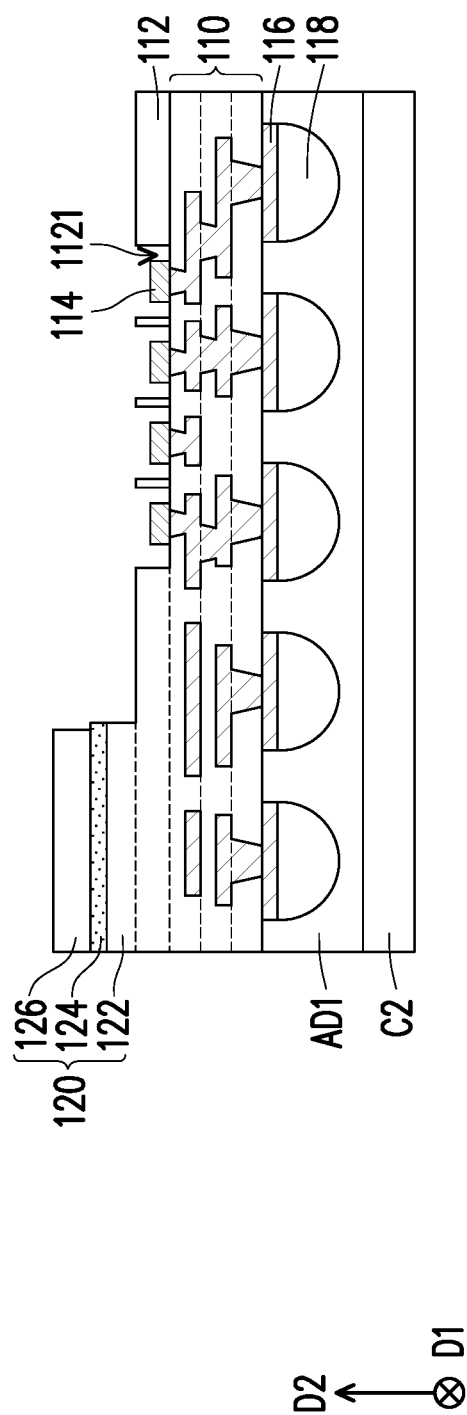

Subsequently, as shown in FIG. 6, the sacrificial layer SC1 and the sacrificial layer SC2 are removed to expose the connectors 104 and the openings 1121. In some embodiments, the sacrificial layer SC1 and the sacrificial layer SC2 are removed by a suitable selective etch process. The selective etch process may include one or more suitable wet etch processes, one or more suitable dry etch processes, combinations thereof, or the like. In some embodiments, the wet tech processes may be performed using suitable strippers. In some embodiments, the dry tech processes may be performed using gasses, such as $O_2$, Ar, a combination thereof, or the like.

Figure 7:
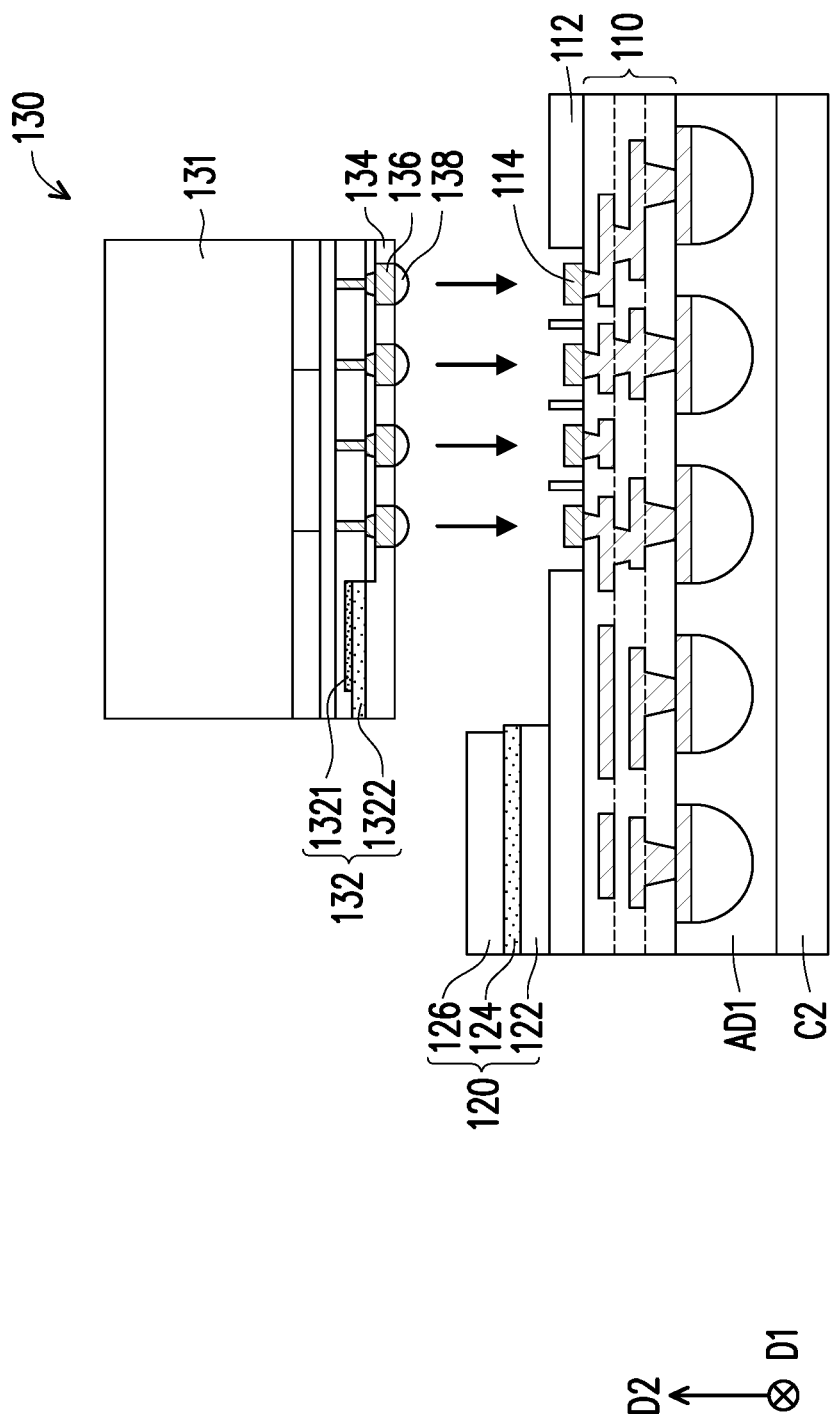
Figure 8:
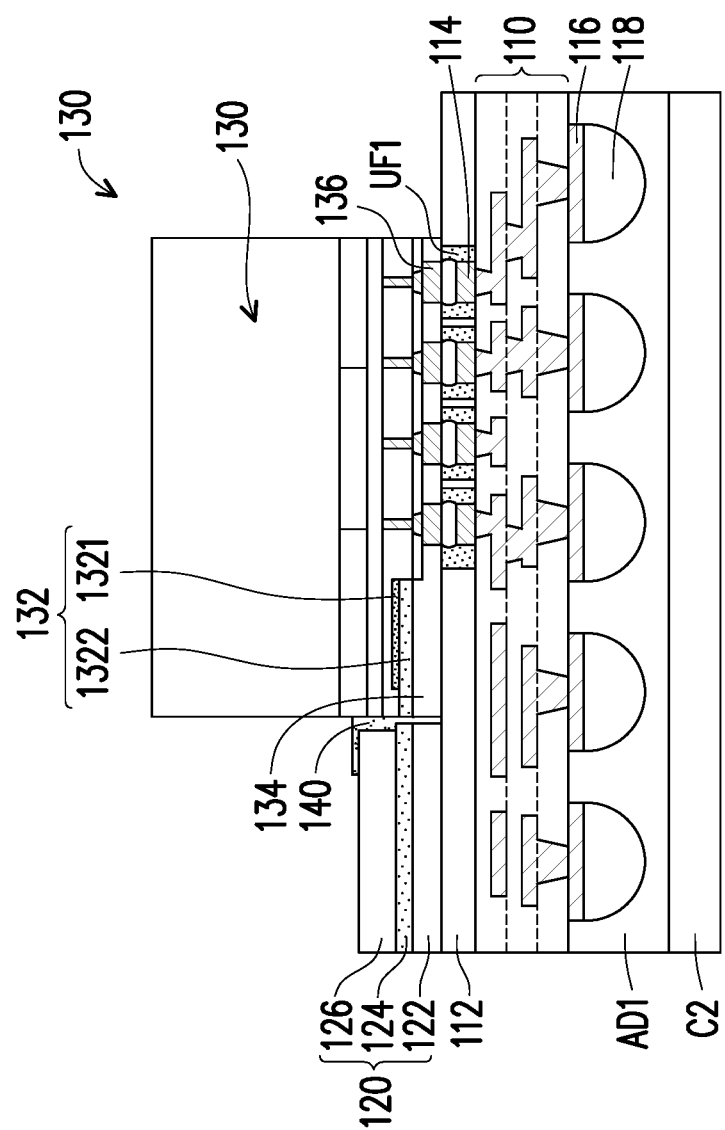

Referring to FIG. 7 and FIG. 8, a semiconductor device 130 is mounted over the device mounting region of the supporting layer 112 and are bonded to the connectors 114. In some embodiments, the semiconductor device 130 may be a system on integrated circuit (SoIC) die and may include one or more of the integrated circuit dies packaged to form an integrated circuit package. In some embodiments, the semiconductor device 130 may include a plurality of semiconductor dies electrically connected to one another. The semiconductor dies may be vertically or horizontally arranged according to product design. In some embodiments, one of the semiconductor dies may be, for example, a photonic integrated circuit (PIC) die, and another one of the semiconductor dies is, for example, an electronic integrated circuit (EIC) die.

The EIC die is a device having integration of electronic circuits and components onto a substrate of a semiconductor material by processes of fabrication. The substrate materials include, but are not limited to, silicon (Si), Silicon on insulator (SOI), germanium (Ge), indium phosphide (InP), gallium arsenide (GaAs), gallium nitride (GaN), or the like. Integrated electronic circuits include a combination of active electronic devices with passive components. The active electronic devices include, but are not limited to, transistors, diodes, etc. The passive components include, but are not limited to, resistors, capacitors, inductor, etc. The processes involved in the fabrication of integrated circuits can include, but are not limited to, vapor-phase deposition of semiconductors and insulators, oxidation, solid-state diffusion, ion implantation, vacuum deposition and sputtering, etc.

The PIC die is a device that integrates multiple photonic functions. While EIC process signals are imposed on electrical currents or voltages, the PIC process signals are imposed on optical beams. These optical beams typically have wavelengths ranging from the UV/visible spectrum (200-750 nm) to near Infrared spectrum (750 nm-1650 nm), for example. The materials used for the fabrication of PICs include, but are not limited to, silica (SiO2) on silicon, silicon on insulator (SOI), various polymers and compound semiconductor materials such as GaAs, InP, and GaN.

Integrated photonic devices can be classified into "passive photonic devices" that do not consume or exchange energy; "emissive/absorptive photonic devices" that involve light emission, optical gain, and absorption, or electronic energy level transitions that give rise to the spontaneous emission, stimulated emission, or absorption of photons; "electro-optic devices" that require an applied electrical voltage or current but do not require optical emission/absorption for their main functionalities; and nonlinear optical devices that involve nonlinear-optical properties of materials.

Passive photonic devices include, but are not limited to, optical beam splitters, optical wavelength filters, optical resonators, optical waveguides, optical wavelength multiplexers, optical couplers, optical polarizers, optical isolators, polarization rotators, etc. Emissive photonic devices include, but are not limited to, optical amplifiers, lasers, and light-emitting devices. Absorptive photonic devices include photodetectors, etc. Electro-optic devices include, but are not limited to, electro-optic modulators, electro-optic phase shifters, electro-optic switches, etc. Nonlinear-optical devices include second harmonic generators, photonic transistor, and all-optical switches, etc. Emissive/absorptive, electro-optic, and nonlinear optical devices together are part of "active devices" that are devices that consume or exchange energy.

Beside the above, there are other active devices such as opto-mechanical devices that involve mechanical power but the above are the main classes of active photonic devices of interest here. These active devices of interest are sometimes classified into optoelectronic devices (those that involve applied electrical power) and all optical devices that do not involve applied electrical power. All optical devices are typically devices that involve direct interaction of light with light. These nomenclatures are not always precise in usage and are defined above specifically for their application here.

In some embodiments, the semiconductor device 130 further includes a device waveguide 132 for optical signal transmission. The device waveguide 132 of the semiconductor device 130 is optically coupled to the transition waveguide 124 of the transition waveguide structure 120. In some embodiments, the device waveguide 132 is in the PIC die of the semiconductor device 130, and the device waveguide 132 includes a first waveguide 1322 aligned with the transition waveguide 124 and a second waveguide 1321 disposed over the first waveguide 1322. In some embodiments, the first waveguide 1322 may be a polymer waveguide, and the second waveguide 1321 may be a silicon waveguide consisting of a layer of silicon. In some embodiments, the semiconductor device 130 may further include a dielectric layer 134, a plurality of conductive pads 136, and conductive bumps 138, but are not limited thereto. One or more additional elements or layers may be added or incorporated into the semiconductor device 130 according to needs. The conductive pads 136 is disposed on an outer surface of the semiconductor device 130, while the dielectric layer 134 faces the supporting layer 112 and surrounds the conductive pads 136. The dielectric layer 134 covers the device waveguide 132 and fills between the conductive pads 136. The conductive pads 136 may be formed of the same material (e.g., copper) as the connectors 114 of the redistribution structure 110, but not limited thereto. The conductive bumps 138 are disposed on the conductive pads 136. The conductive bumps 138 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive bumps 138 may include a conductive material such as solder, copper, aluminum, gold, nickel, silver, palladium, tin, the like, or a combination thereof. In some embodiments, the conductive bumps 138 are formed by initially forming a layer of solder through evaporation, electroplating, printing, solder transfer, ball placement, or the like. Once a layer of solder has been formed on the structure, a reflow may be performed in order to shape the material into the desired bump shapes. In other embodiments, the conductive bumps 138 include metal pillars (such as a copper pillar) formed by a sputtering, printing, electro plating, electroless plating, CVD, or the like. In some embodiments, the conductive bumps 138 are bonded to the connectors 114 of the redistribution structure 110 through a bonding process.

Figure 12:
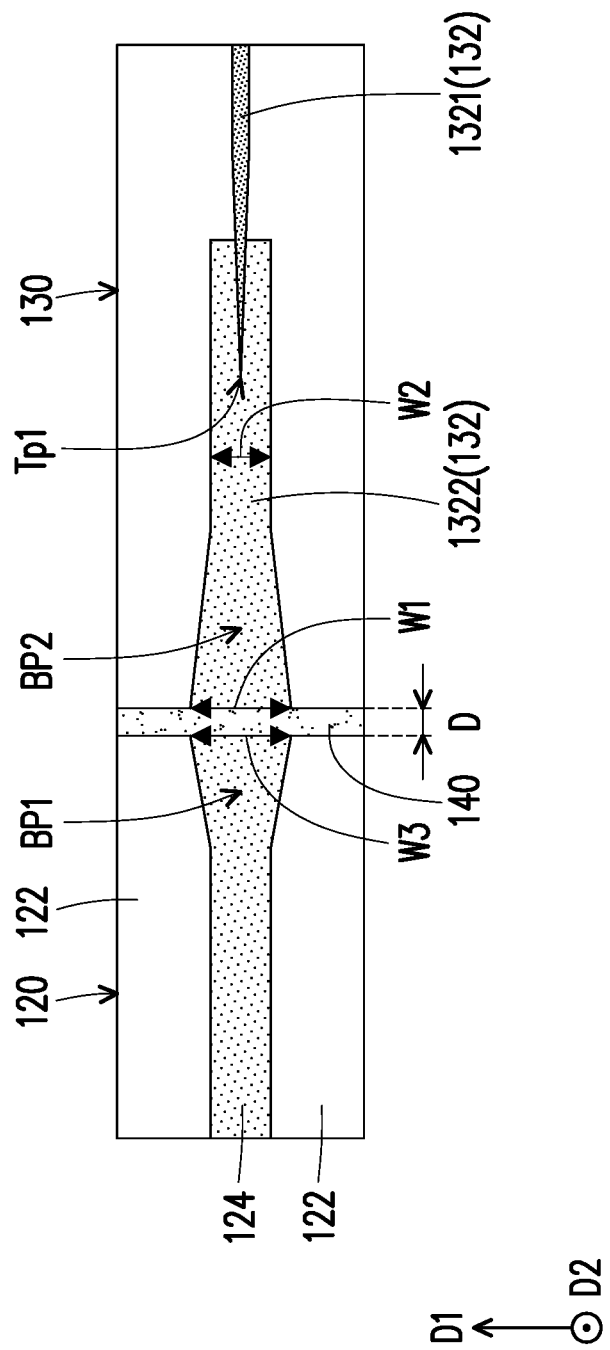
FIG. 12 schematically illustrates a partial top view of a semiconductor package according to some embodiments of the present disclosure.

Referring to FIG. 8 and FIG. 12, in accordance to one of the embodiments, by controlling thicknesses of the components (e.g., the supporting layer 112, the lower dielectric layer 122, the dielectric layer 134) between the redistribution structure 110, and the semiconductor device 130, the device waveguide 132 of the semiconductor device 130 can be aligned with the transition waveguide 124 of the transition waveguide structure 120 after the semiconductor device 130 are bonded onto the redistribution structure 110. In some embodiments, the first waveguide 1322 is disposed between the second waveguide 1321 and the dielectric layer 134. In some embodiments, the first waveguide 1322 is aligned with the transition waveguide 124. The first waveguide 1322 may be formed in a manner similar to the transition waveguide 124, and may be formed of a similar material as the transition waveguide 124.

In some embodiments, as illustrated in FIG. 12, the second waveguide 1321 may be in a taper shape and a tip TP1 that is aligned with or points toward the transition waveguide 124 of the transition waveguide structure 120. For example, the diameter of the tip TP1 is about 75 nm to 85 nm. In one embodiment, the diameter of the top TP1 is about 80 nm. The second waveguide 1321 is optically coupled to the first waveguide 1322 underneath. In some embodiments, the first waveguide 1322 includes a broaden portion BP2, which is aligned with the transition waveguide 124 in the top view as shown in FIG. 12. In one embodiment, the width W1 of the broaden portion BP2 is substantially greater than the primary width W2 of the primary portion of the first waveguide 1322. For example, the width W1 of the broaden portion BP2 is about 8 μm to about 10 μm. In one embodiment, the width W1 is about 9 μm. From a top view, a minimum width (e.g., primary width W2) of the first waveguide 1322 is greater than a maximum width (diameter) of the second waveguide 1321. In some embodiment, the transition waveguide 124 may have a broaden portion BP1 aligned to the broaden portion BP2, and the width W3 of the broaden portion BP1 is substantially greater than the primary width of the primary portion of the transition waveguide 124. In other embodiment, the transition waveguide 124 may have a uniform width without any broaden portion. The maximum width of the transition waveguide 124 may be substantially the same or similar to the width W1 of the broaden portion BP2 of the first waveguide 1322. The broaden portion BP2 of the first waveguide 1322 is aligned with the transition waveguide 124 in the top view shown in FIG. 12, and the first waveguide 1322 and the transition waveguide 124 have the same or similar height in the cross-sectional view shown in FIG. 8.

With such configuration, the second waveguide 1321 is optically coupled to the transition waveguide 124 through the first waveguide 1322. By integrating the first waveguide 1322 into the device waveguide 132, tolerance in a first direction D1 (e.g., a direction perpendicular to of the arrangement direction of the transition waveguide 120 and the semiconductor device 130) and a second direction D2 (e.g., the normal direction of the upper surface of the redistribution structure 110) can be improved when aligning the device waveguide 132 with the transition waveguide 124, and thus higher alignment accuracy and less alignment time can be achieved. In addition, by integrating the transition waveguide 120 with wider alignment width (e.g., broaden portion width W3) into the semiconductor package, tolerance in the first direction D1 and the second direction D2 can be improved in subsequent optical fiber assembly (e.g., the optical fiber 200 shown in FIG. 11, which is disposed beside the transition waveguide 120), and thus higher assembly accuracy and less assembly time can be achieved. Moreover, by making the refractive index design of the second waveguide 1321, the first waveguide 1322, and the dielectric layer 134 meet the condition of total internal reflection, the amount of light leaking from the first waveguide 1322 can be reduced. In this way, optical loss inside the semiconductor device 130 or at the edge of the semiconductor device 130 can be reduced.

In some embodiments, an optical adhesive 140 is disposed between the transition waveguide 120 and the device waveguide 132 after the semiconductor device 130 are bonded to the connectors 114 of the redistribution structure 110. The transition waveguide structure 120 is disposed over the supporting layer 112 and adjacent to the device waveguide 132 of the semiconductor device 130. In some embodiments, the optical adhesive 140 fills the gap D between the transition waveguide structure 120 and the device waveguide 132 as illustrated in FIG. 12. The optical adhesive 140 assists in fixing the transition waveguide structure 120 and the semiconductor device 130 and optically coupling the transition waveguide 124 to the device waveguide 132. Specifically, after the semiconductor device 130 is disposed on the redistribution structure 110, a gap may be formed between the transition waveguide structure 120 and the semiconductor device 130. By disposing the optical adhesive 140 between the transition waveguide structure 120 and the device waveguide 130, the optical adhesive 140 may serve as a medium for optical transmission. The optical adhesive 140 may be an optical clear adhesive (OCA), or the like.

In some embodiments, an underfill material UF1 may be filled between the supporting layer 112 and side surfaces of the connectors 114. In other words, the underfill material UF1 is filled in the openings 1121 of the supporting layers 112 and encapsulates the connectors 114, the conductive pads 136, and the conductive bumps 138. The underfill material UF1 may be formed by a capillary flow process after the semiconductor device 130 is bonded to the redistribution structure 110 or may be formed by a suitable deposition method before the semiconductor device 130 is attached to the redistribution structure 110.

Figure 9:
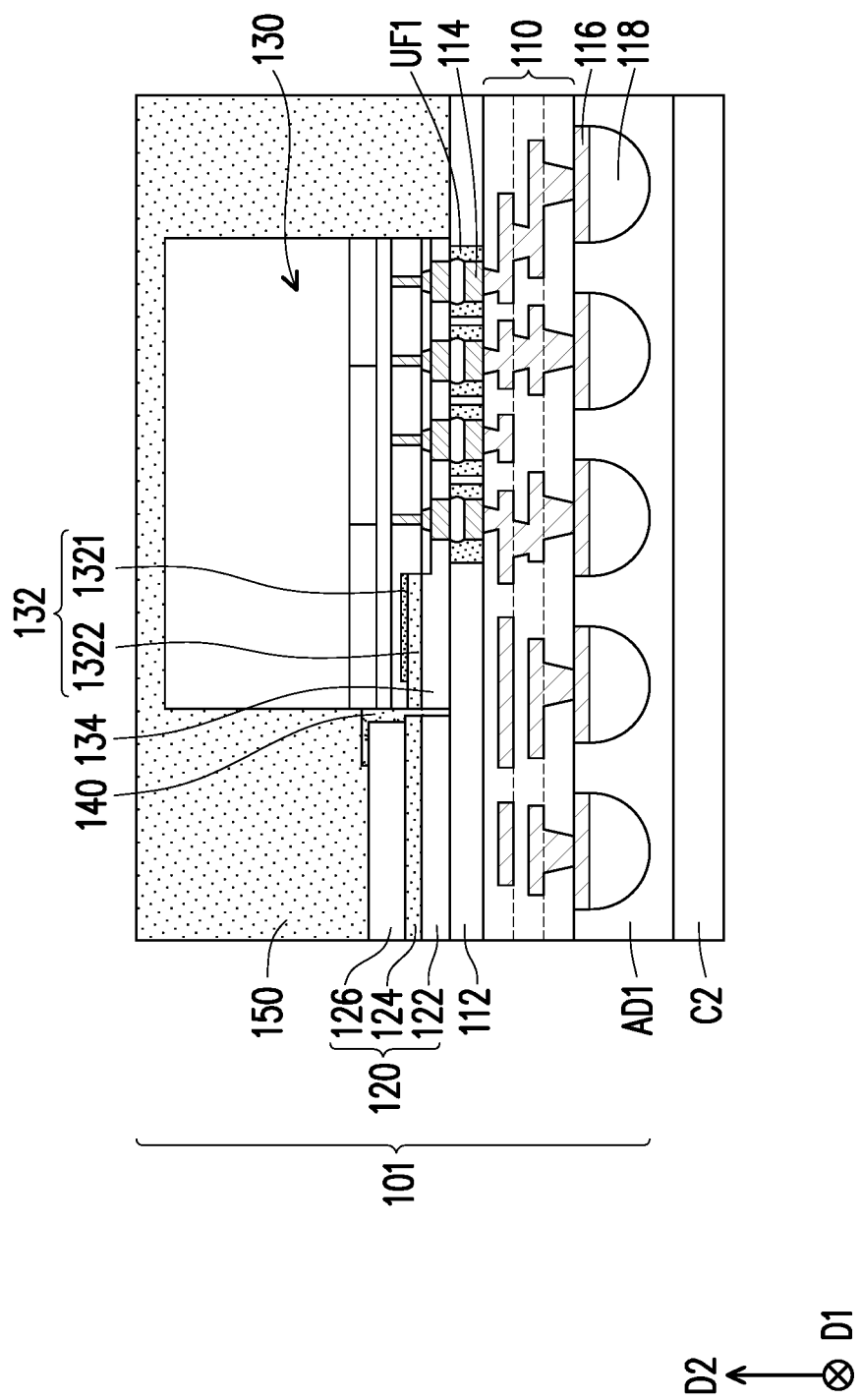

Referring to FIG. 9, in some embodiments, an encapsulating material 150 is formed over the redistribution structure 110 and encapsulates the semiconductor device 130. The encapsulating material 150 may be a molding compound, epoxy, or the like. The encapsulating material 150 may be applied by compression molding, transfer molding, or the like, and may be formed over the redistribution structure 110 such that the semiconductor device 130 is buried or covered. The encapsulating material 150 may be applied in liquid or semi-liquid form and then subsequently cured. In some embodiments, a planarization process may be performed on the encapsulating material 150 to expose the back surface of the semiconductor device 130. The planarization process may be, for example, a chemical-mechanical polish (CMP), a grinding process, or the like. In some embodiments, the planarization may be omitted.

Throughout the description, the resultant structure formed over the carrier substrate C2 shown in FIG. 9 is referred to as a package component 101, which includes the redistribution structure 110 having the connectors 114, the supporting layer 112, the semiconductor device 130 including a device waveguide 132, the transition waveguide structure 120, the encapsulating material 150, and the conductive connectors 118. The supporting layer 112 is disposed over the redistribution structure 110 and located beside and between the connectors 114. The semiconductor device 130 is disposed on the supporting layer 112 and bonded to the connectors 114. The transition waveguide structure 120 is disposed on the supporting layer 112 and optically coupled to the device waveguide 132. The encapsulating material 150 is over the redistribution structure 110 and at least encapsulates the semiconductor device 130. The UBM layers 116 and the conductive connectors 118 are disposed over the back of the redistribution structure 110. The package component 101 may be in a wafer form during the manufacturing process.

Figure 10:
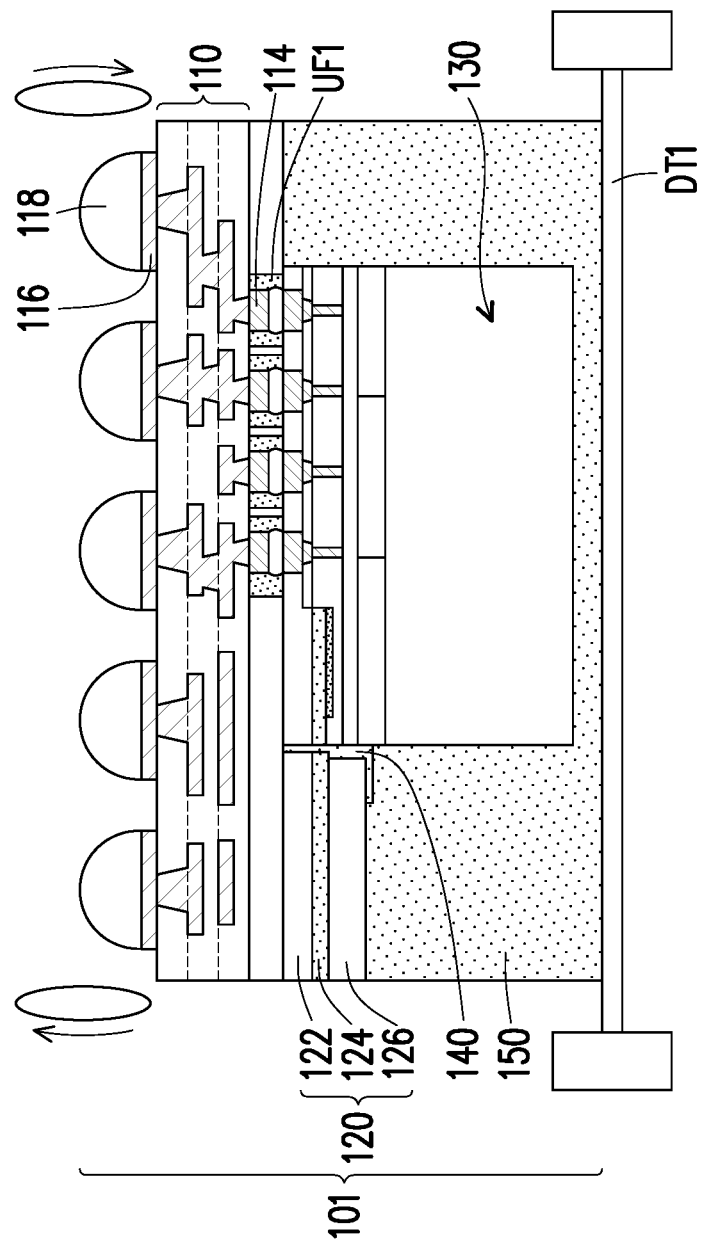
Figure 11:
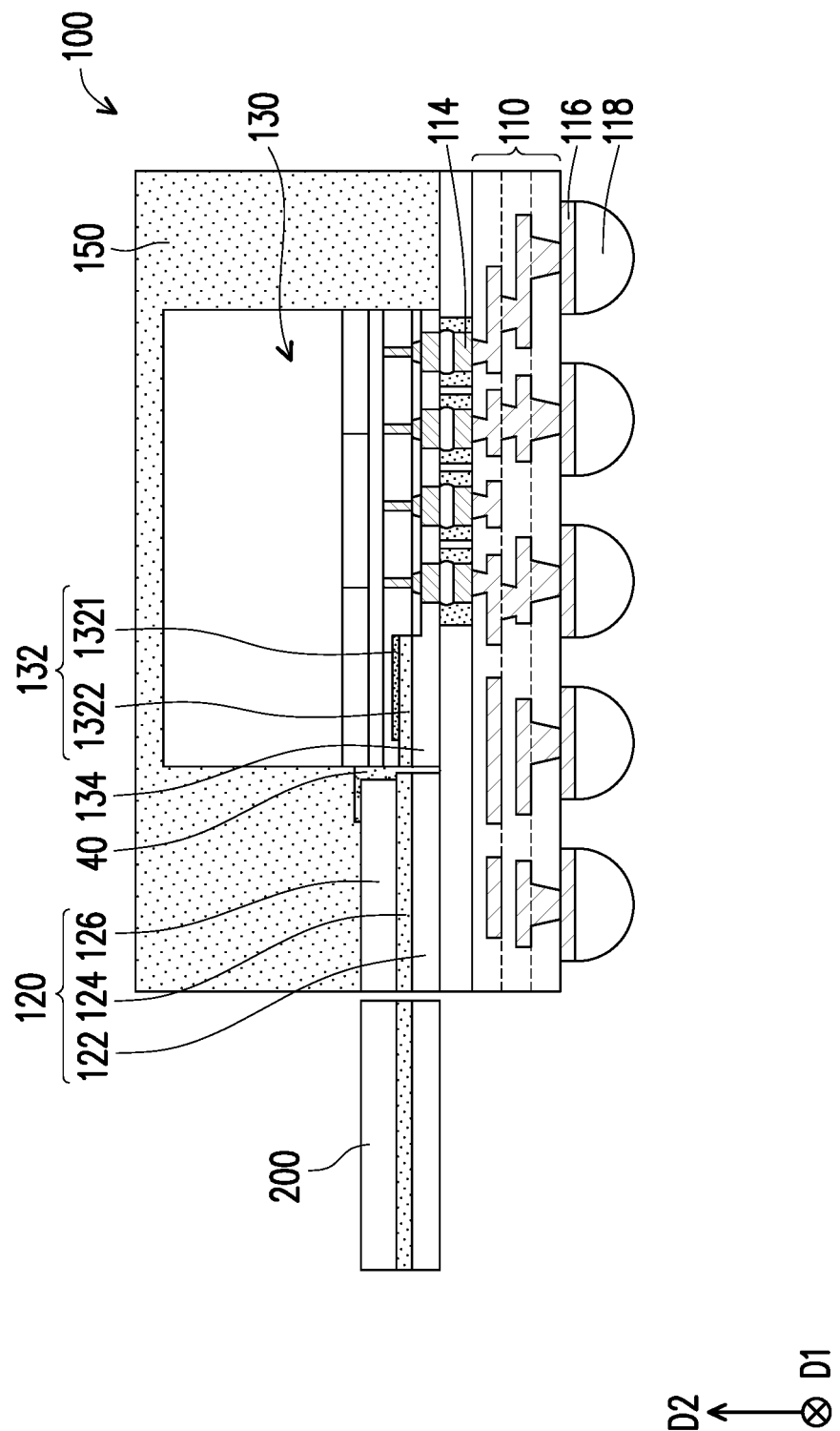

Referring to FIG. 10, in some embodiments, the package component 101 is flipped over and placed on a dicing tape DT1. Subsequently, the carrier substrate C2 is de-bonded, and the adhesive layer AD1 is removed. Then, a singulation process is performed by sawing along scribe line regions, e.g., between adjacent package regions of the package component 101. The sawing singulates the package component 101 and forms a plurality of (identical) semiconductor packages 100 shown in FIG. 11 (one of the semiconductor packages 100 is illustrated in FIG. 11). In some embodiments, as illustrated in FIG. 11, an optical fiber 200 may then be disposed over the redistribution structure 110 and optically coupled to the device waveguide 132 through the transition waveguide structure 120.

By integrating the transition waveguide 120 with wider alignment width (e.g., broaden portion width W3 shown in FIG. 12) into the semiconductor package, tolerance in the first direction D1 and the second direction D2 can be improved in the alignment of the optical fiber 200, which is disposed beside the transition waveguide 120, and thus higher assembly accuracy and less assembly time can be achieved. In addition, with the configuration of the supporting layer 112 surrounding each of the connectors 114, not only the supporting layer 112 between the connectors 114 keeps the connectors 114 from bridging during subsequent bonding process, but the supporting layer 112 also provides support to the semiconductor device 130, so the semiconductor device 130 can be evenly and supported and leveled with the transition waveguide structure 120. Moreover, the supporting layer 112 surrounding each of the connectors 114 can also provide support during the planarization process, which improves the yield and performance of the planarization process. Accordingly, the semiconductor package 100 can achieve a planar base for a semiconductor device 130 to be leveled with the transition waveguide structure 120, and also improve the alignment between the device waveguide 132 and the optical fiber 200 through the transition waveguide structure 120.

FIG. 13 to FIG. 17 schematically illustrate cross-sectional views of intermediate stages in the manufacturing of a semiconductor package according to some embodiments of the present disclosure. FIG. 1 to FIG. 11 merely illustrates one of the possible manufacturing processes of the semiconductor package. Other suitable manufacturing processes may also be applied. FIG. 13 to FIG. 17 illustrates another one of the possible manufacturing processes for forming the semiconductor package for illustration purpose. It is noted that the manufacturing process of the semiconductor package shown in FIG. 13 to FIG. 17 contains many features same as or similar to the manufacturing process of the semiconductor package disclosed earlier with FIG. 1 to FIG. 11. For purpose of clarity and simplicity, detail description of same or similar features may be omitted, and the same or similar reference numbers denote the same or like components.

Figure 13:
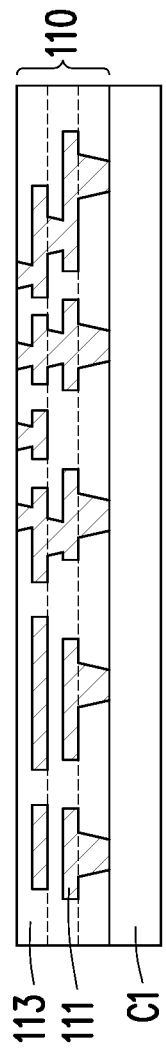
FIG. 13 to FIG. 17 schematically illustrate cross-sectional views of intermediate stages in the manufacturing of a semiconductor package according to some embodiments of the present disclosure.

Referring to FIG. 13, in some embodiments, the redistribution structure 110 is formed over the carrier substrate C1. In some embodiments, a release layer (not shown) may be formed on the carrier substrate C1 prior to the redistribution structure 110. Subsequently, referring to FIG. 14, a plurality of connectors 114 and a supporting layer 112 are formed over the redistribution structure 110. In some embodiments, the supporting layer 112 has a plurality of openings 1121 exposing and surrounding the connectors 114 respectively. It is noted that the connectors 114 and the supporting layer 112 herein may be formed and configured in a manner the same or similar to the supporting layer 112 in the previous embodiments, and may be formed of the same or similar material as the connectors 114 and the supporting layer 112 in the previous embodiments. Then, the sacrificial layer SC2 is formed over the redistribution structure 110 to fill the openings 1121 and cover the connectors 114 that is exposed by the supporting layer 112.

Figure 14:
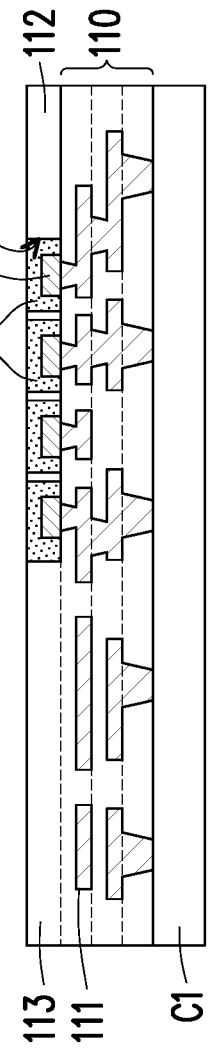
Figure 15:
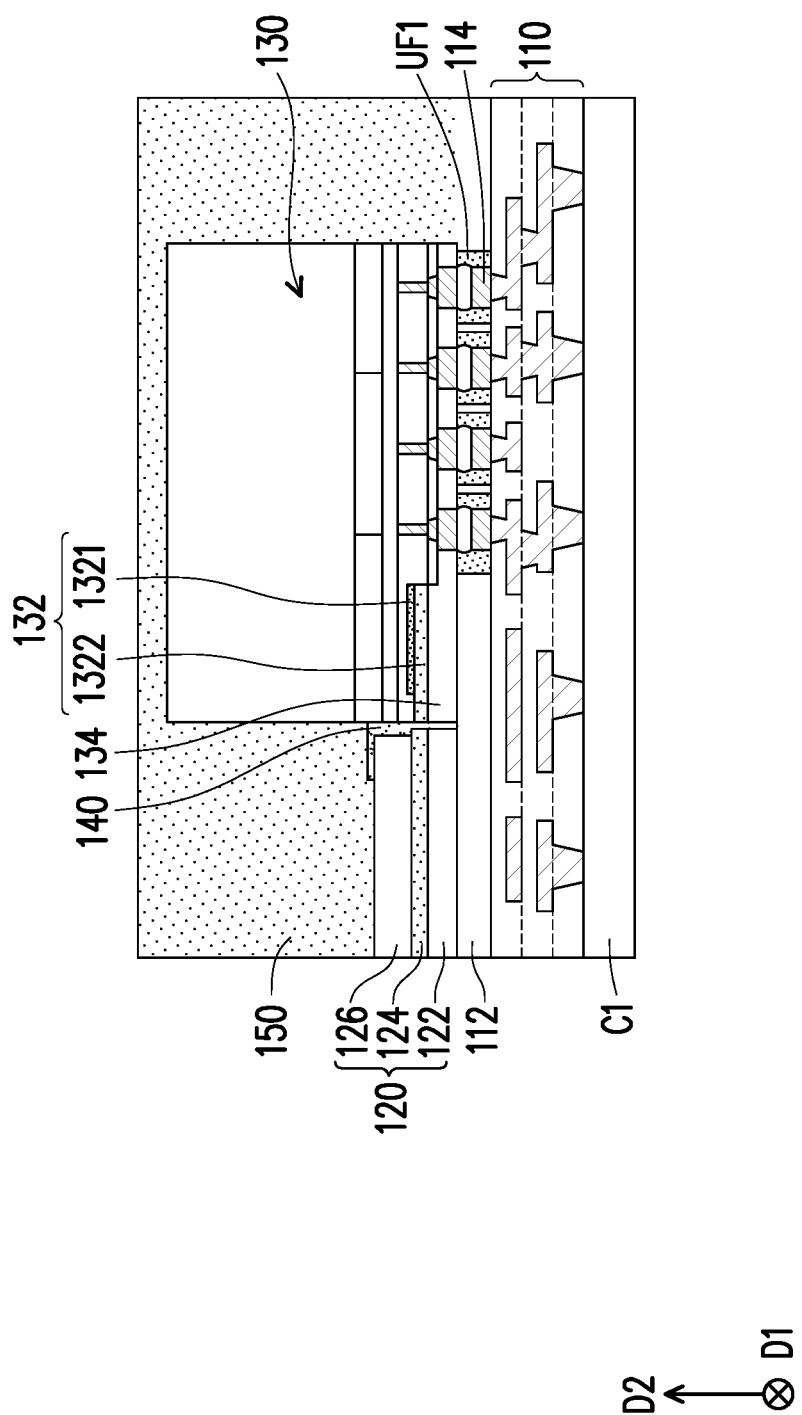
Figure 16:
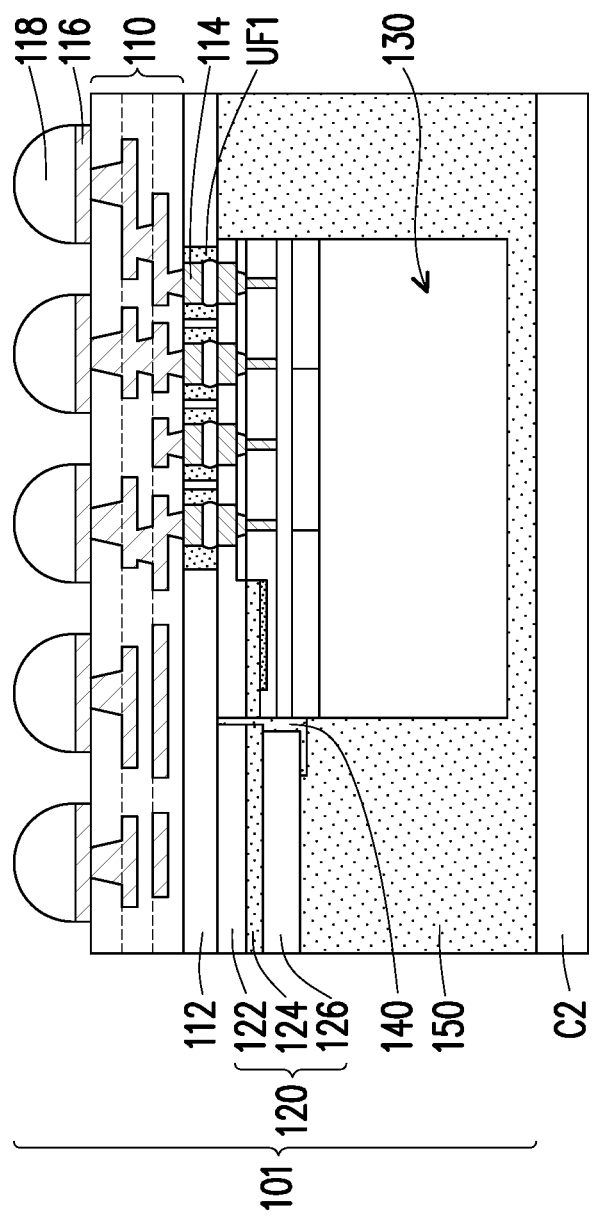

Then, subsequent processes the same as (or at least similar to) the processes illustrated in FIG. 4 to FIG. 9 are sequentially applied over the structure shown in FIG. 14, and the resultant structure shown in FIG. 15 is arrived. With now reference to FIG. 16, the resultant structure shown in FIG. 16 is flipped over and placed on the carrier substrate C2. In some embodiments, a release layer (not shown) may be formed between the carrier substrate C2 and the package component 102. Then, the carrier substrate C1 is de-bonded. Afterwards, the UBM layers 116 and the conductive connectors 118 are sequentially formed over the back surface (e.g., upper surface in the orientation of FIG. 16) of the redistribution structure 110.

Throughout the description, the resultant structure shown in FIG. 16 is referred to as a package component 101, which includes the redistribution structure 110 having the connectors 114, the supporting layer 112, the semiconductor device 130 including a device waveguide 132, the transition waveguide structure 120, the encapsulating material 150, and the conductive connectors 118. The supporting layer 112 is disposed over the redistribution structure 110 and located beside and between the connectors 114. The semiconductor device 130 is disposed on the supporting layer 112 and bonded to the connectors 114. The transition waveguide structure 120 is disposed on the supporting layer 112 and optically coupled to the device waveguide 132. The encapsulating material 150 is over the redistribution structure 110 and at least encapsulates the semiconductor device 130. The UBM layers 116 and the conductive connectors 118 are disposed over the back of the redistribution structure 110. The package component 102 may be in a wafer form during the manufacturing process.

Figure 17:
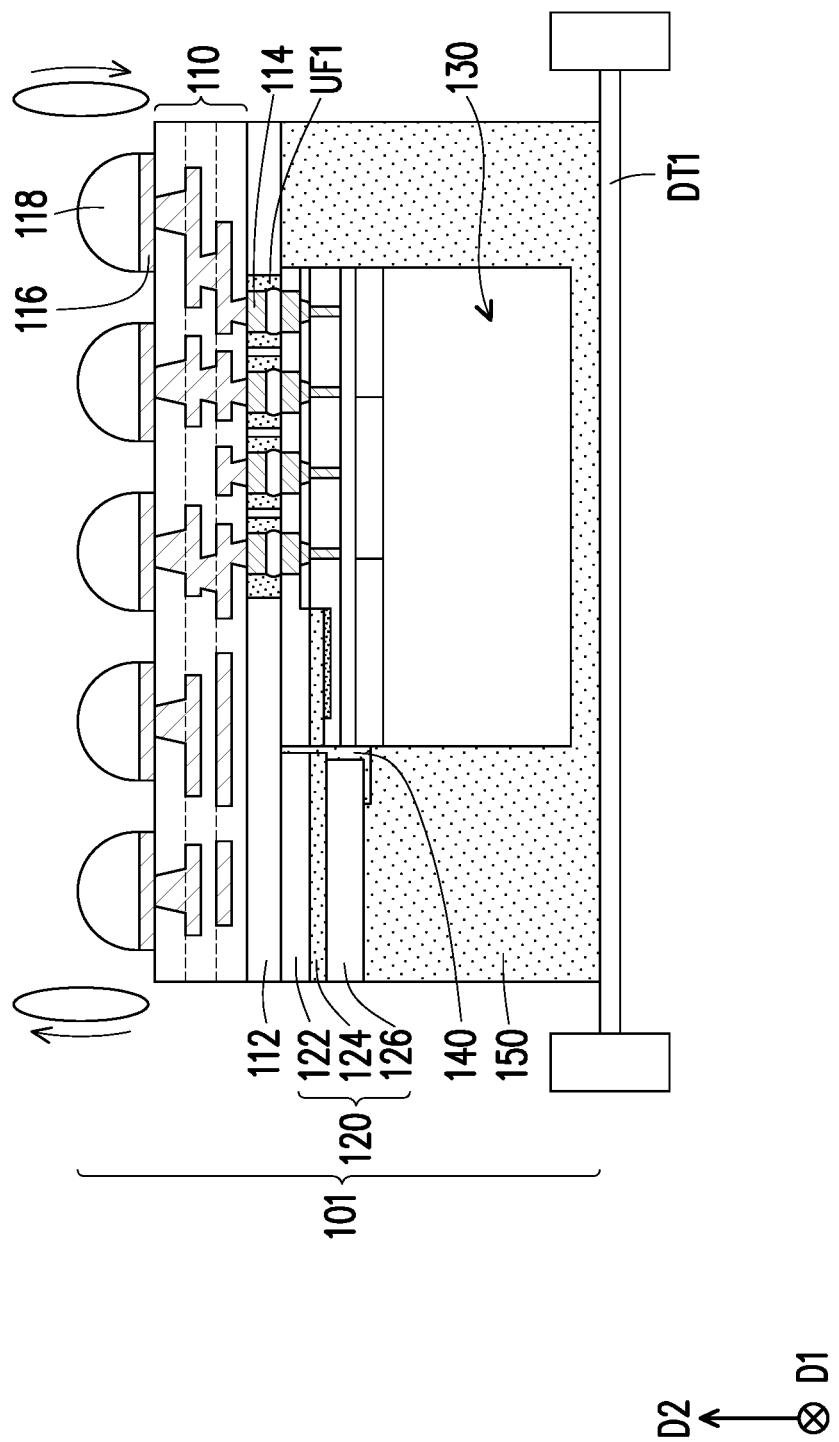

Referring to FIG. 17, the resultant structure shown in FIG. 16 is placed on the dicing tape DT1. Then, a singulation process is performed by sawing along scribe line regions, e.g., between adjacent package regions of the package component 101. The sawing singulates the package component 101 and forms a plurality of (identical) semiconductor packages 100 shown in FIG. 11 (one of the semiconductor packages 100 is illustrated in FIG. 11).

Figure 18:
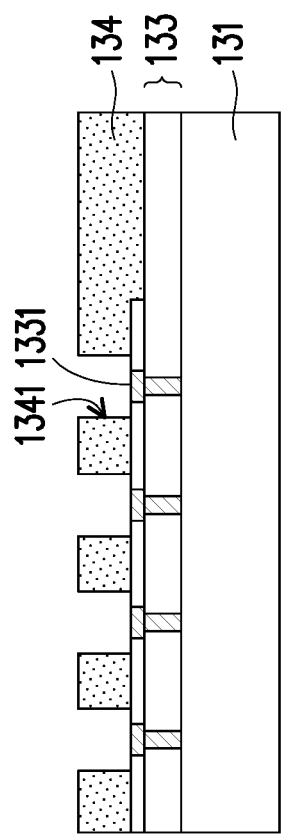
FIG. 18 to FIG. 20 schematically illustrate cross-sectional views of intermediate stages in the manufacturing of a semiconductor package according to some embodiments of the present disclosure.
Figure 19:
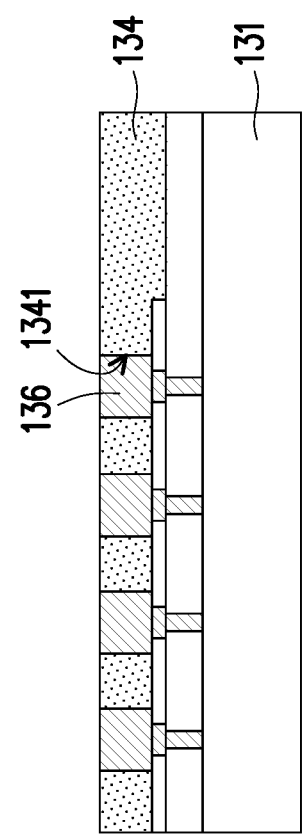
Figure 20:
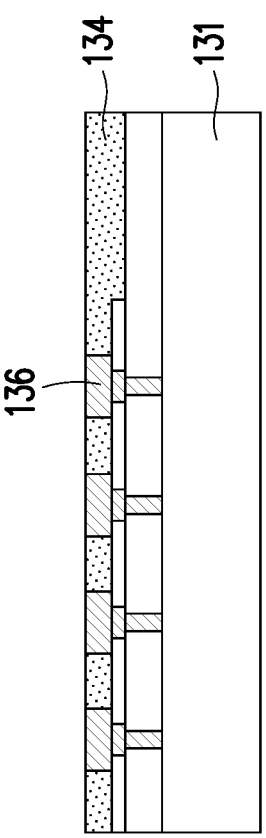

FIG. 18 to FIG. 20 schematically illustrate cross-sectional views of intermediate stages in the manufacturing of a semiconductor package according to some embodiments of the present disclosure. FIG. 21 to FIG. 26 schematically illustrate cross-sectional views of intermediate stages in the manufacturing of a semiconductor package according to some embodiments of the present disclosure. It is noted that the manufacturing process of a semiconductor package shown in FIG. 18 to FIG. 26 contains many features same as or similar to the manufacturing process of the semiconductor package disclosed earlier with FIG. 1 to FIG. 11. For purpose of clarity and simplicity, detail description of same or similar features may be omitted, and the same or similar reference numbers denote the same or like components.

Figure 26:
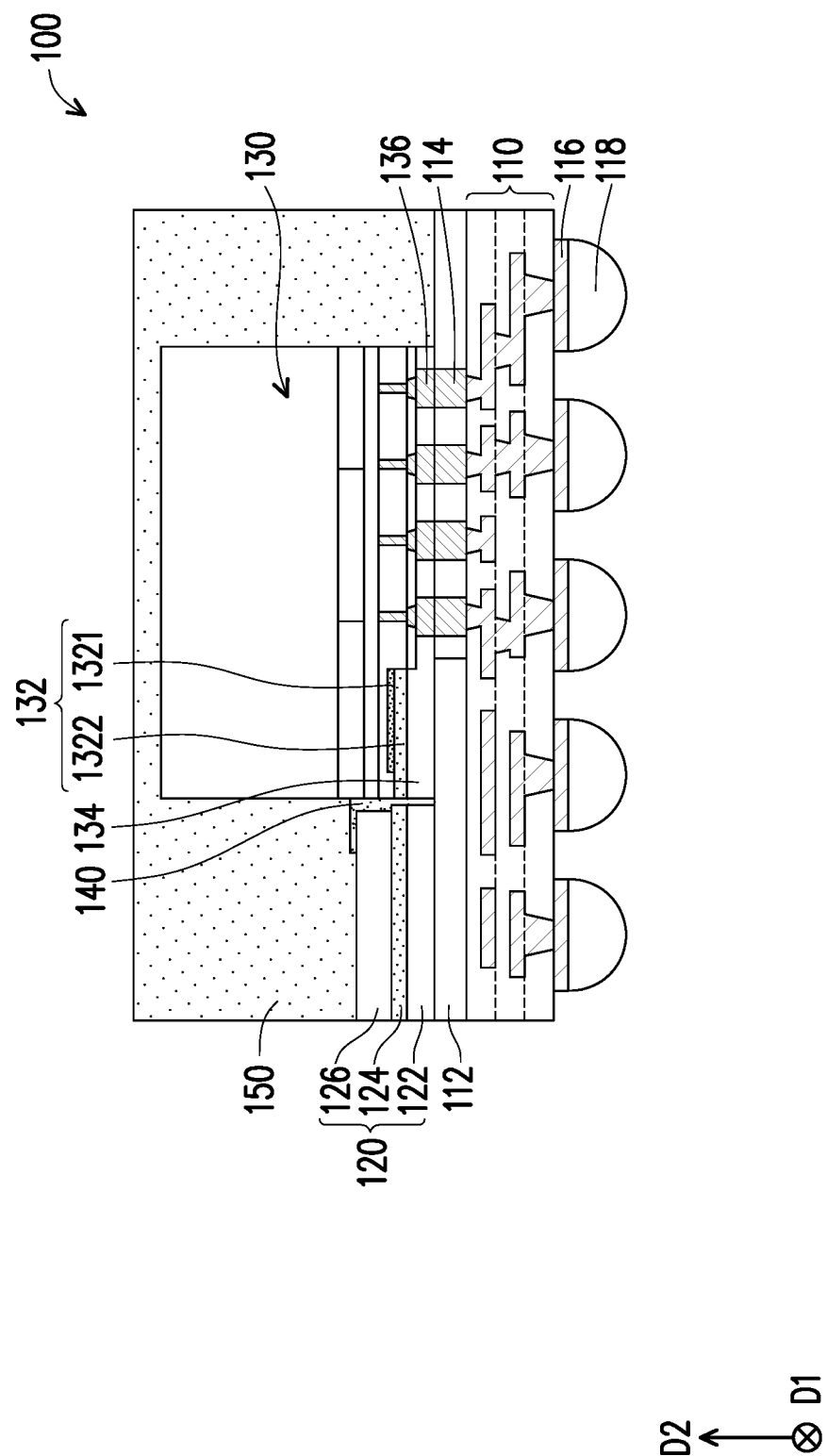

FIG. 18 to FIG. 20 illustrate one of the possible processes of manufacturing a semiconductor device 130 of a semiconductor package shown in FIG. 26, and the process of manufacturing the semiconductor device 130 may also be applied to the semiconductor packages in previous embodiments. In some embodiments, a device die shown in FIG. 18 including a substrate 131 is provided. The substrate 131 may be a bulk silicon substrate although other semiconductor materials including group III, group IV, and group V elements may also be used. Alternatively, the substrate 131 may be a silicon-on-insulator (SOI) substrate. Active devices (not shown) such as transistors and photodiodes may be formed on the top surface of the substrate 131. In some embodiments, the device die further includes interconnect layers formed over the substrate 131. The interconnect layers may include an inter-layer dielectric (ILD) and/or inter-metal dielectric layers (IMD) containing conductive features (e.g., metal lines and vias, not shown) formed over the substrate 131 using any suitable method. The interconnect layers may connect various active devices in the substrate 131 to form functional circuits.

In some embodiments, redistribution layers (RDLs) 133 may be formed over the substrate 131. The RDLs 133 may include polymer layers or dielectric layers (e.g., comprising USG) having interconnect structures (e.g., metal lines and vias) that route the electrical circuits formed in interconnect layers to desired locations in the device die. In some embodiments, the device die further includes a dielectric layer 134 having a plurality of openings 1341 for exposing a plurality of contacts 1331 of the RDLs 133. In some embodiments, the dielectric layer 134 may be an oxide layer, which is formed on a top surface of the device die shown in FIG. 18. The dielectric layer 134 may comprise silicon oxynitride (SiON), SiO2, SiN, SiC, or the like, and may be used as a bonding interface layer for bonding semiconductor device to the supporting layer of the redistribution structure during a subsequent hybrid bonding process (described further herein in FIG. 25). Although the dielectric layer 134 is described herein as an oxide layer, any interfacial layer suitable for direct bonding to another interfacial layer (e.g., through fusion bonding) may be used in alternative embodiments in lieu of an oxide. In some embodiments, the dielectric layer 134 may be formed in a manner similar to the supporting layer 112, and may be formed of a similar material as the supporting layer 112. In some embodiments, the dielectric layer 134 may be patterned, for example, using a combination of photolithography and etching to form the openings 1341 for exposing the contacts 1331 respectively.

Then, referring to FIG. 19, the openings 1341 are filled with conductive material, for example, copper or a copper alloy, to form a plurality of conductive pads 136. The filling of the openings 1341 may include an electro-chemical plating (ECP) process. In some embodiments, the conductive material may overflow the openings 1341 and cover a top surface of the dielectric layer 134. In various embodiments, a barrier layer (not shown) and/or a seed layer (not shown) may be formed, for example, using physical vapor deposition, CVD, or the like in the openings 1341 prior to the filling of the openings 1341 with conductive material.

Subsequently, as illustrated in FIG. 20, a planarization (e.g., a chemical mechanical polish (CMP)) process may be performed to remove overflow portions of conductive material to form the conductive pads 136 shown in FIG. 20. At the time, the manufacturing of the semiconductor device 130 may be substantially done. The planarization process may result in the top surfaces of the conductive pads 136 being substantially coplanar with the top surface of the dielectric layer 134 to ensure proper bonding of semiconductor device 130 to the redistribution structure 110.

Figure 21:
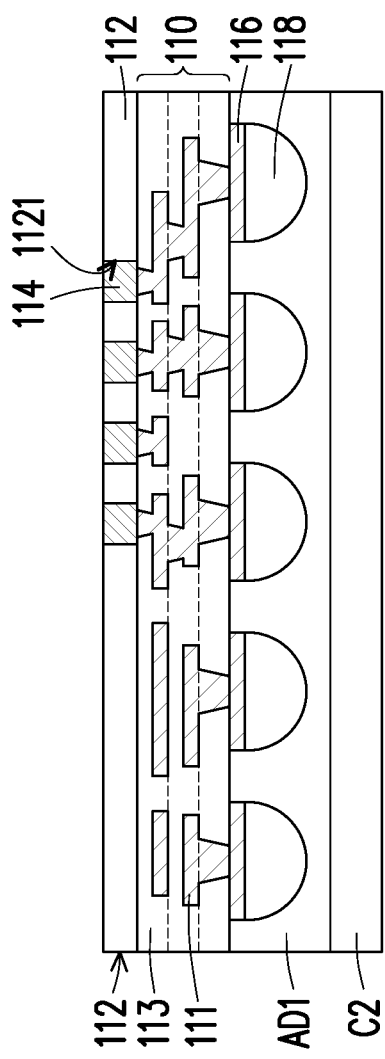
FIG. 21 to FIG. 26 schematically illustrate cross-sectional views of intermediate stages in the manufacturing of a semiconductor package according to some embodiments of the present disclosure.

With now reference to FIG. 21, in some embodiments, the redistribution structure 110 along with the UBM layers 116, and the conductive connectors 118 are provided over a carrier substrate C2 through an adhesive layer AD1. The adhesive layer AD1 may include any suitable adhesive, epoxy, DAF, or the like. The carrier substrate C2 may be a glass carrier substrate, a ceramic carrier substrate, or the like. Then, a supporting layer 112 having a plurality of openings 1121 are formed over the redistribution structure 110. The openings 1121 of the dielectric layer 134 may be formed, for example, using a combination of photolithography and etching for exposing contacts of the redistribution structure 110 underneath respectively. In some embodiments, the openings 1121 may then be filled with conductive material, for example, copper or a copper alloy to form a plurality of connectors 114. The filling of the openings 1121 may include an electro-chemical plating (ECP) process. In some embodiments, the conductive material may overflow the openings 1121 and cover a top surface of the supporting layer 112. In various embodiments, a barrier layer (not shown) and/or a seed layer (not shown) may be formed, for example, using physical vapor deposition, CVD, or the like in the openings 1121 prior to the filling of the openings 1121 with conductive material. Accordingly, the openings 1121 of the supporting layer 112 surround the connectors 114 on the redistribution structure 110.

Subsequently, a (first) planarization (e.g., a chemical mechanical polish (CMP)) process may be performed over the supporting layer 112 and the conductive material to remove overflow portions of conductive material to form the connectors 114 shown in FIG. 21. The planarization process may result in the supporting layer 112 encapsulating (in contact with) side surfaces of the connectors 114, and the top surfaces of the connectors 114 being substantially coplanar with the top surface of the supporting layer 112 to ensure proper bonding of semiconductor device 130 to the redistribution structure 110.

Figure 22:
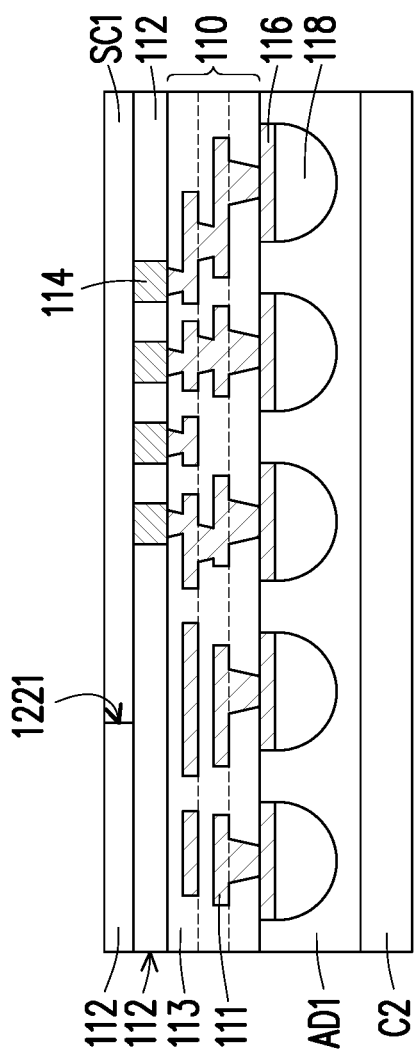

Referring to FIG. 22, the lower dielectric layer 122 is formed over the supporting layer 122. In some embodiments, the lower dielectric layer 122 includes a concave 1221 exposing the connectors 114. Subsequently, a sacrificial layer SC1 is formed over the supporting layer 112 and the connectors 114 that are exposed by concave 1221 of the lower dielectric layer 122. In other words, the sacrificial layer SC1 fills the concave 1221. In some embodiments, the sacrificial layer SC1 includes polyimide, polyolefin, a combination thereof, or the like and may be formed using spin coating, or the like. Subsequently, a (second) planarization (e.g., a chemical mechanical polish (CMP)) process may be performed over lower dielectric layer 122 and the sacrificial layer SC1. The planarization process may result in the top surface of the lower dielectric layer 122 being substantially coplanar with the top surface of the sacrificial layer SC1 to ensure proper alignment between the device waveguide 132 of semiconductor device 130 and transition waveguide 124 over the redistribution structure 110, which are illustrated in FIG. 26.

Figure 23:
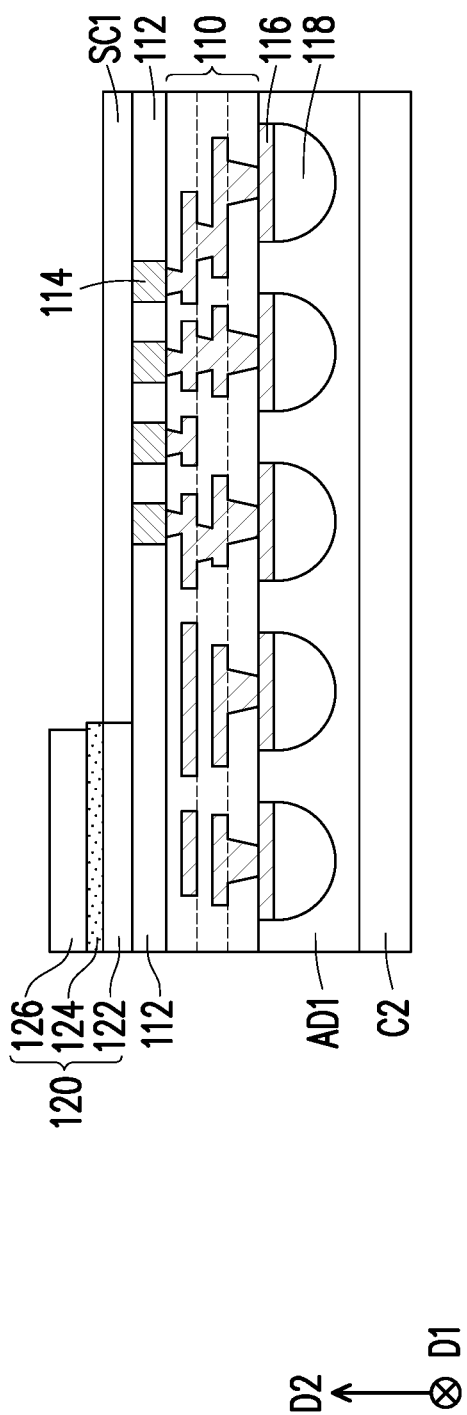

Referring to FIG. 23, then, the transition waveguide 124 and the upper dielectric layer 126 are sequentially formed over the lower dielectric layer 122. Throughout the description, the stack of the lower dielectric layer 122, the transition waveguide 124 and the upper dielectric layer 126 is referred to as a transition waveguide structure 120, wherein the transition waveguide 124 is sandwiched between the lower dielectric layer 122 and the upper dielectric layer 126. In some embodiments, the transition waveguide 124 is a polymer waveguide, which may be formed of an organic polymer, such as polyimide, polyolefin, PBO, the like, or a combination thereof. Subsequently, the organic polymer material layer is patterned using suitable photolithography processes. Subsequently, the upper dielectric layer 126 is formed on the transition waveguide 124. The upper dielectric layer 126 may be formed in a manner similar to the lower dielectric layer 122, and may be formed of a similar material as the lower dielectric layer 122.

Figure 24:
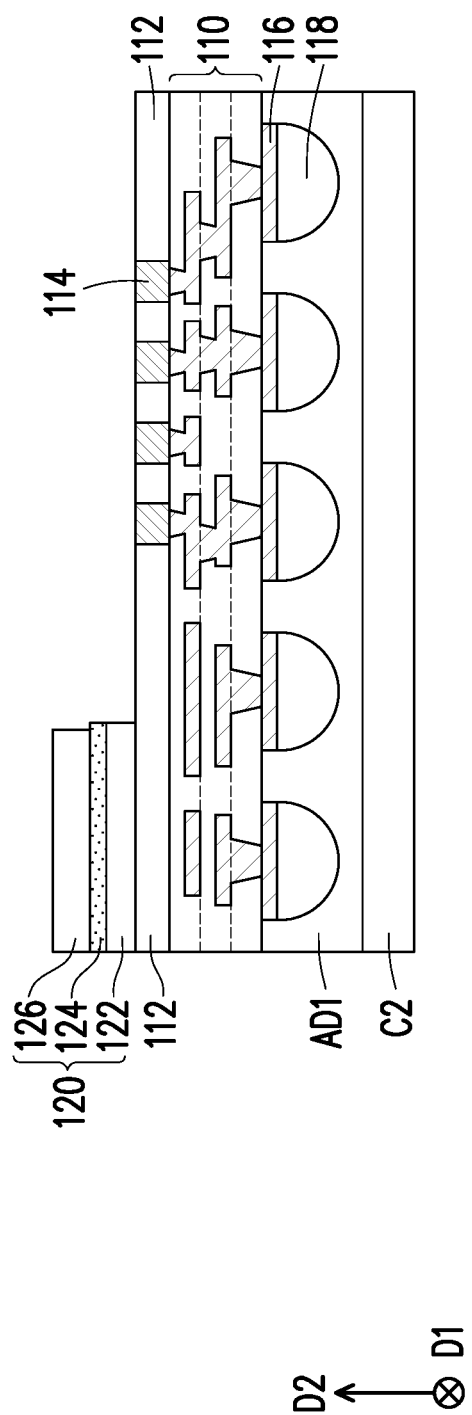

Subsequently, as shown in FIG. 24, the sacrificial layer SC1 are removed to expose the connectors 114 and the supporting layer 112 underneath. In some embodiments, the sacrificial layer SC1 is removed by a suitable selective etch process. The selective etch process may include one or more suitable wet etch processes, one or more suitable dry etch processes, combinations thereof, or the like. In some embodiments, the wet tech processes may be performed using suitable strippers. In some embodiments, the dry tech processes may be performed using gasses, such as $O_2$, Ar, a combination thereof, or the like. Accordingly, the planarized supporting layer 112 under the transition waveguide structure 120 and the device waveguide 132 provides even support and a planar base for alignment.

Figure 25:
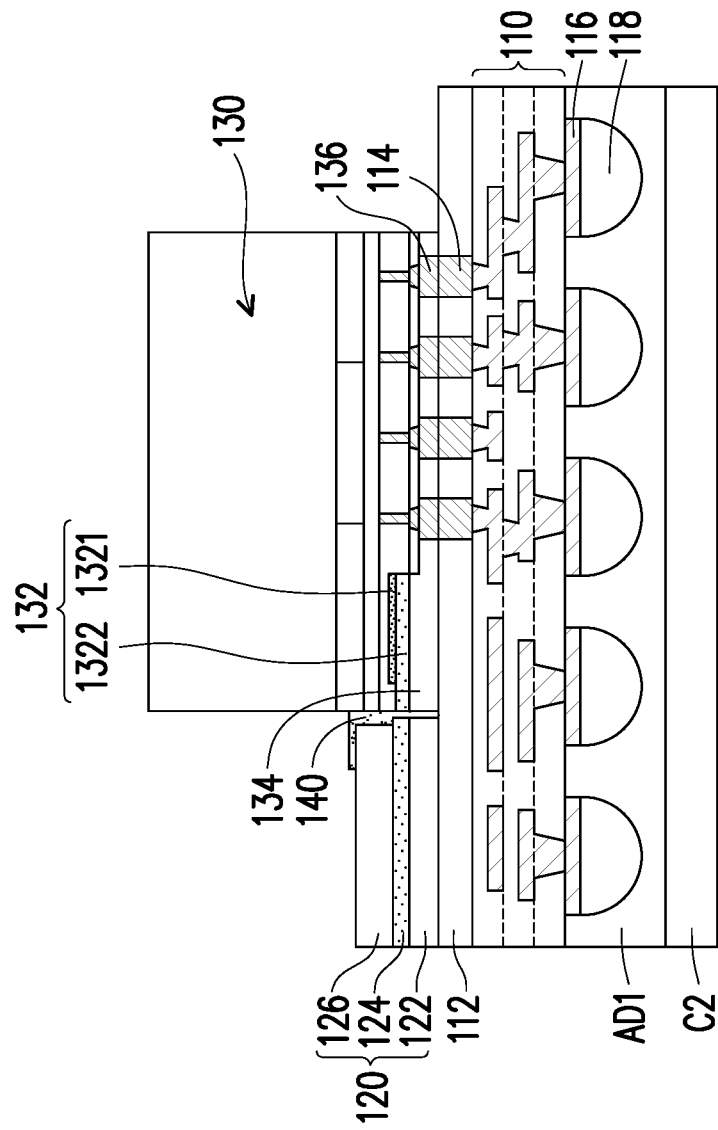

Referring to FIG. 25, the semiconductor device 130 (formed by at least the processes illustrated in FIG. 18 to FIG. 20) is bonded to the connectors 114. In some embodiments, the semiconductor device 130 includes the device waveguide 132, which is optically coupled to the transition waveguide 124 after the bonding process. In some embodiments, the conductive pads 136 of the semiconductor device 130 are bonded to the connectors 114 through direct bonding. In one embodiment, the semiconductor device 130 is bonded to the redistribution structure 110 through hybrid bonding. In general, hybrid bond includes both a dielectric-to-dielectric bond and a metal-to-metal (copper-to copper) bond. In some embodiments, the dielectric-to-dielectric bond is a fusion bond or an oxide-to-oxide bond. Accordingly, in such embodiment, the supporting layer 112 and the dielectric layer 134 to be bonded together may include, for example, one or more of silicon oxynitride, silicon dioxide, and silicon nitride. The copper-to-copper bond may be, for example, a pure-copper-to-copper-alloy bond or a copper-alloy-to-copper-alloy bond.

In some embodiments, the supporting layer 112 and the dielectric layer 134 are bonded with each other through, for example, fusion bonding process. In particular, the supporting layer 112 and the dielectric layer 134 may be aligned and then contacted together to begin the hybrid bonding procedure. At this stage, the conductive pads 136 and the connectors 114 may not be bonded yet. After the dielectric layer 134 is in contact with the supporting layer 112, a thermal annealing process may be utilized to strengthen the bond between the supporting layer 112 and the dielectric layer 134 and to additionally bond the conductive pads 136 and the connectors 114. The annealing process conditions may include increasing the temperature from room temperature (e.g., about 20° C.) to a suitable annealing temperature (e.g., between about 150° C. and about 400° C.) at a rate of 5° C. per minute. The temperature may be maintained at the annealing temperature for about two hours. The annealing process expands the conductive material of the conductive pads 136 and the connectors 114 to bond the conductive pads 136 and the connectors 114 and electrically connecting the semiconductor device 130 and the redistribution structure 110.

Subsequently, the optical adhesive 140 is provided between the transition waveguide structure 120 and the semiconductor device 130 after the semiconductor device 130 are bonded to the redistribution structure 110. In some embodiments, the optical adhesive 140 at least fills the gap between the transition waveguide structure 120 and the device waveguide 132 of the semiconductor device 130. The optical adhesive 140 assists in fixing the transition waveguide structure 120 and the semiconductor device 130 and optically coupling the transition waveguide 124 to the device waveguide 132. Specifically, after the semiconductor device 130 is disposed on the redistribution structure 110, a gap may be formed between the transition waveguide structure 120 and the semiconductor device 130. By disposing the optical adhesive 140 between the transition waveguide structure 120 and the device waveguide 130, the optical adhesive 140 may serve as a medium for optical transmission. The optical adhesive 140 may be an optical clear adhesive (OCA), or the like.

Referring to FIG. 26, an encapsulating material 150 is formed over the redistribution structure 110 and encapsulates the semiconductor device 130. The encapsulating material 150 may be a molding compound, epoxy, or the like. The encapsulating material 150 may be applied by compression molding, transfer molding, or the like, and may be formed over the redistribution structure 110 such that the semiconductor device 130 is buried or covered. The encapsulating material 150 may be applied in liquid or semi-liquid form and then subsequently cured. In some embodiments, a planarization process may be performed on the encapsulating material 150 to expose the back surface of the semiconductor device 130. The planarization process may be, for example, a chemical-mechanical polish (CMP), a grinding process, or the like. In some embodiments, the planarization may be omitted. Then, a singulation process is performed over the resultant structure shown in FIG. 25 over a dicing tape. The singulation process forms a plurality of (identical) semiconductor packages 100 shown in FIG. 26 (one of the semiconductor packages 100 is illustrated in FIG. 26).

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with an embodiment, a semiconductor package includes a redistribution structure, a supporting layer, a semiconductor device, and a transition waveguide structure. The redistribution structure includes a plurality of connectors. The supporting layer is formed over the redistribution structure and disposed beside and between the plurality of connectors. The semiconductor device is disposed on the supporting layer and bonded to the plurality of connectors, wherein the semiconductor device includes a device waveguide. The transition waveguide structure is disposed on the supporting layer adjacent to the semiconductor device, wherein the transition waveguide structure is optically coupled to the device waveguide. In an embodiment, the supporting layer includes a mesa portion disposed beside the plurality of connectors and under the transition waveguide structure and the device waveguide and an isolation portion connecting the mesa portion and surrounding each of the plurality of connectors. In an embodiment, a top surface of the mesa portion is substantially coplanar with a top surface of the isolation portion. In an embodiment, the transition waveguide structure includes a lower dielectric layer, a transition waveguide, and an upper dielectric layer sequentially stacked over the supporting layer, and the transition waveguide is aligned with the device waveguide. In an embodiment, the semiconductor device further includes a dielectric layer facing the supporting layer and surrounding a plurality of pads of the semiconductor device, wherein the dielectric layer covers the device waveguide. In an embodiment, the device waveguide includes a first waveguide aligned with the transition waveguide and a second waveguide disposed over the first waveguide. In an embodiment, the second waveguide is in a taper shape and has a tip pointing toward the transition waveguide. In an embodiment, from a top view, a minimum width of the first waveguide is greater than a maximum width of the second waveguide. In an embodiment, the semiconductor package further includes an underfill material, wherein the supporting layer is spaced apart from side surfaces of the plurality of connectors, and the underfill material fills between the supporting layer and side surfaces of the plurality of connectors. In an embodiment, the supporting layer encapsulates side surfaces of the plurality of connectors, and a top surface of the supporting layer is substantially coplanar with top surfaces of the plurality of connectors. In an embodiment, the semiconductor package further includes an optical fiber disposed over the redistribution structure and optically coupled to the device waveguide through the transition waveguide structure.

In accordance with another embodiment, a manufacturing method of a semiconductor package includes the following steps. A supporting layer is formed over a redistribution structure. A first planarization process is performed over the supporting layer. A lower dielectric layer is formed over the supporting layer, wherein the lower dielectric layer includes a concave exposing a device mounting region of the supporting layer. A first sacrificial layer is formed over the supporting layer, wherein the sacrificial layer filling the concave. A second planarization process is performed over the lower dielectric layer and the first sacrificial layer. A transition waveguide provided over the lower dielectric layer. The first sacrificial layer is removed. A semiconductor device is mounted over the device mounting region, wherein the semiconductor device includes a device waveguide is optically coupled to the transition waveguide. In an embodiment, the supporting layer having a plurality of openings exposing a plurality of connectors of the redistribution structure respectively. In an embodiment, the concave exposing the plurality of connectors. In an embodiment, the manufacturing method of the semiconductor package further includes: forming a second sacrificial layer over the redistribution structure to fill the plurality of openings and encapsulate the plurality of connectors before the first planarization process is performed. In an embodiment, the first planarization process is performed on the supporting layer and the second sacrificial layer. In an embodiment, the manufacturing method of the semiconductor package further includes: filling an optical adhesive between the transition waveguide and the device waveguide.

In accordance with yet another embodiment, a manufacturing method of a semiconductor package includes the following steps. A supporting layer is formed over a redistribution structure, wherein the supporting layer includes a plurality of openings surrounding a plurality of connectors on the redistribution structure. A first planarization process is performed over the supporting layer. A lower dielectric layer is formed over the supporting layer, wherein the lower dielectric layer includes a concave exposing the plurality of connectors. A sacrificial layer is formed over the supporting layer, wherein the sacrificial layer filling the concave. A second planarization process is performed over the lower dielectric layer and the sacrificial layer. A transition waveguide is provided over the lower dielectric layer. The first sacrificial layer is removed. A semiconductor device is bonded to the plurality of connectors, wherein the semiconductor device includes a device waveguide is optically coupled to the transition waveguide. In an embodiment, the first planarization process is performed over the supporting layer and the plurality of connectors. In an embodiment, the method of bonding the semiconductor device to the plurality of connectors includes direct bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a redistribution structure comprising a plurality of connectors;
   a supporting layer over the redistribution structure and disposed beside and between the plurality of connectors;
   a semiconductor device disposed on the supporting layer and bonded to the plurality of connectors, wherein the semiconductor device comprises a device waveguide; and
   a transition waveguide structure disposed on the supporting layer adjacent to the semiconductor device, wherein the transition waveguide structure is optically coupled to the device waveguide.

2. The semiconductor package as claimed in claim 1, wherein the supporting layer comprises a mesa portion disposed beside the plurality of connectors and under the transition waveguide structure and the device waveguide and an isolation portion connecting the mesa portion and surrounding each of the plurality of connectors.

3. The semiconductor package as claimed in claim 1, wherein a top surface of the mesa portion is substantially coplanar with a top surface of the isolation portion.

4. The semiconductor package as claimed in claim 1, wherein the transition waveguide structure comprises a lower dielectric layer, a transition waveguide, and an upper dielectric layer sequentially stacked over the supporting layer, and the transition waveguide is aligned with the device waveguide.

5. The semiconductor package as claimed in claim 1, wherein the semiconductor device further comprises a dielectric layer facing the supporting layer and surrounding a plurality of pads of the semiconductor device, wherein the dielectric layer covers the device waveguide.

6. The semiconductor package as claimed in claim 1, wherein the device waveguide comprises a first waveguide aligned with the transition waveguide and a second waveguide disposed over the first waveguide.

7. The semiconductor package as claimed in claim 6, wherein the second waveguide is in a taper shape and has a tip pointing toward the transition waveguide.

8. The semiconductor package as claimed in claim 6, wherein, from a top view, a minimum width of the first waveguide is greater than a maximum width of the second waveguide.

9. The semiconductor package as claimed in claim 1, further comprising an underfill material, wherein the supporting layer is spaced apart from side surfaces of the plurality of connectors, and the underfill material fills between the supporting layer and side surfaces of the plurality of connectors.

10. The semiconductor package as claimed in claim 1, wherein the supporting layer encapsulates side surfaces of the plurality of connectors, and a top surface of the supporting layer is substantially coplanar with top surfaces of the plurality of connectors.

11. The semiconductor package as claimed in claim 1, further comprising:
   an optical fiber disposed over the redistribution structure and optically coupled to the device waveguide through the transition waveguide structure.

* * * * *